(12) United States Patent
Tseng

(10) Patent No.: US 12,356,699 B2
(45) Date of Patent: Jul. 8, 2025

(54) METHOD FOR FORMING SEMICONDUCTOR DEVICE STRUCTURE WITH SECOND SPACER OVER SECOND SIDEWALL OF FIN STRUCTURE

(71) Applicant: Taiwan Semiconductor Manufacturing Company, Ltd., Hsinchu (TW)

(72) Inventor: Szu-Wei Tseng, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 481 days.

(21) Appl. No.: 17/741,948

(22) Filed: May 11, 2022

(65) Prior Publication Data

US 2023/0369497 A1 Nov. 16, 2023

(51) Int. Cl.
*H10D 84/01* (2025.01)
*H10D 30/01* (2025.01)
*H10D 30/62* (2025.01)
*H10D 84/03* (2025.01)

(52) U.S. Cl.
CPC ....... *H10D 84/0158* (2025.01); *H10D 30/024* (2025.01); *H10D 30/6211* (2025.01); *H10D 30/6219* (2025.01); *H10D 84/013* (2025.01); *H10D 84/0147* (2025.01); *H10D 84/038* (2025.01)

(58) Field of Classification Search
CPC ..... H01L 21/823418; H01L 21/823431; H01L 21/823468; H10D 84/0158; H10D 84/013; H10D 84/0147
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2021/0126097 A1* | 4/2021 | Ju | H01L 29/775 |
| 2021/0134797 A1* | 5/2021 | Lin | H01L 29/775 |

* cited by examiner

*Primary Examiner* — Michael Jung
(74) *Attorney, Agent, or Firm* — Birch, Stewart, Kolasch & Birch, LLP

(57) ABSTRACT

A method for forming a semiconductor device structure is provided. The method includes forming a dielectric layer over a substrate. The substrate has a base and a fin structure over the base, and the dielectric layer is over the base and surrounds the fin structure. The method includes forming a gate stack over the fin structure and the dielectric layer. The method includes removing portions of the dielectric layer, which are not covered by the gate stack. The method includes forming first spacers over first sidewalls of the gate stack. The method includes forming second spacers over second sidewalls of the fin structure. The method includes partially removing the fin structure, which is not covered by the gate stack and the first spacers. The method includes forming a source/drain structure over the fin structure, which is not covered by the gate stack and the first spacers.

20 Claims, 26 Drawing Sheets

METHOD FOR FORMING SEMICONDUCTOR DEVICE STRUCTURE WITH SECOND SPACER OVER SECOND SIDEWALL OF FIN STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a cross-sectional view illustrating the semiconductor device structure along a sectional line I-I' in FIG. 1A, in accordance with some embodiments.

FIG. 1B-1 is a cross-sectional view illustrating the semiconductor device structure along a sectional line I-I' in FIG. 1B, in accordance with some embodiments.

FIG. 1C-1 is a cross-sectional view illustrating the semiconductor device structure along a sectional line I-I' in FIG. 1C, in accordance with some embodiments.

FIG. 1D-1 is a cross-sectional view illustrating the semiconductor device structure along a sectional line I-I' in FIG. 1D, in accordance with some embodiments.

FIG. 1E-1 is a cross-sectional view illustrating the semiconductor device structure along a sectional line I-I' in FIG. 1E, in accordance with some embodiments.

FIG. 1F-1 is a cross-sectional view illustrating the semiconductor device structure along a sectional line I-I' in FIG. 1F, in accordance with some embodiments.

FIG. 1G-1 is a cross-sectional view illustrating the semiconductor device structure along a sectional line I-I' in FIG. 1G, in accordance with some embodiments.

FIG. 2A-1 is a cross-sectional view illustrating the semiconductor device structure along a sectional line I-I' in FIG. 2A, in accordance with some embodiments.

FIG. 2B-1 is a cross-sectional view illustrating the semiconductor device structure along a sectional line I-I' in FIG. 2B, in accordance with some embodiments.

FIG. 2C-1 is a cross-sectional view illustrating the semiconductor device structure along a sectional line I-I' in FIG. 2C, in accordance with some embodiments.

FIG. 2D-1 is a cross-sectional view illustrating the semiconductor device structure along a sectional line I-I' in FIG. 2D, in accordance with some embodiments.

FIG. 2E-1 is a cross-sectional view illustrating the semiconductor device structure along a sectional line I-I' in FIG. 2E, in accordance with some embodiments.

FIG. 2F-1 is a cross-sectional view illustrating the semiconductor device structure along a sectional line I-I' in FIG. 2F, in accordance with some embodiments.

DETAILED DESCRIPTION

Figure 1A:
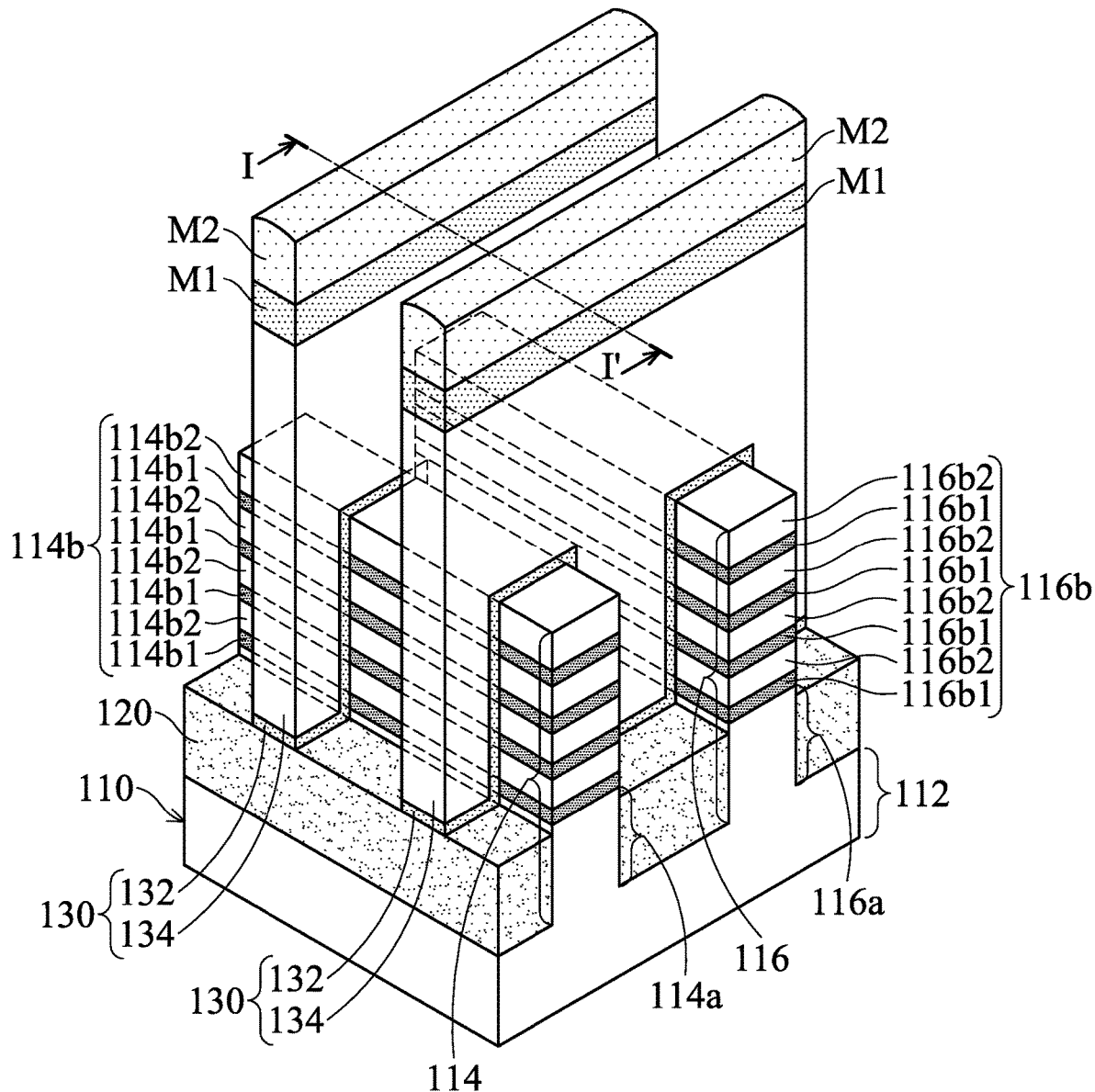
FIGS. 1A-1G are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A:
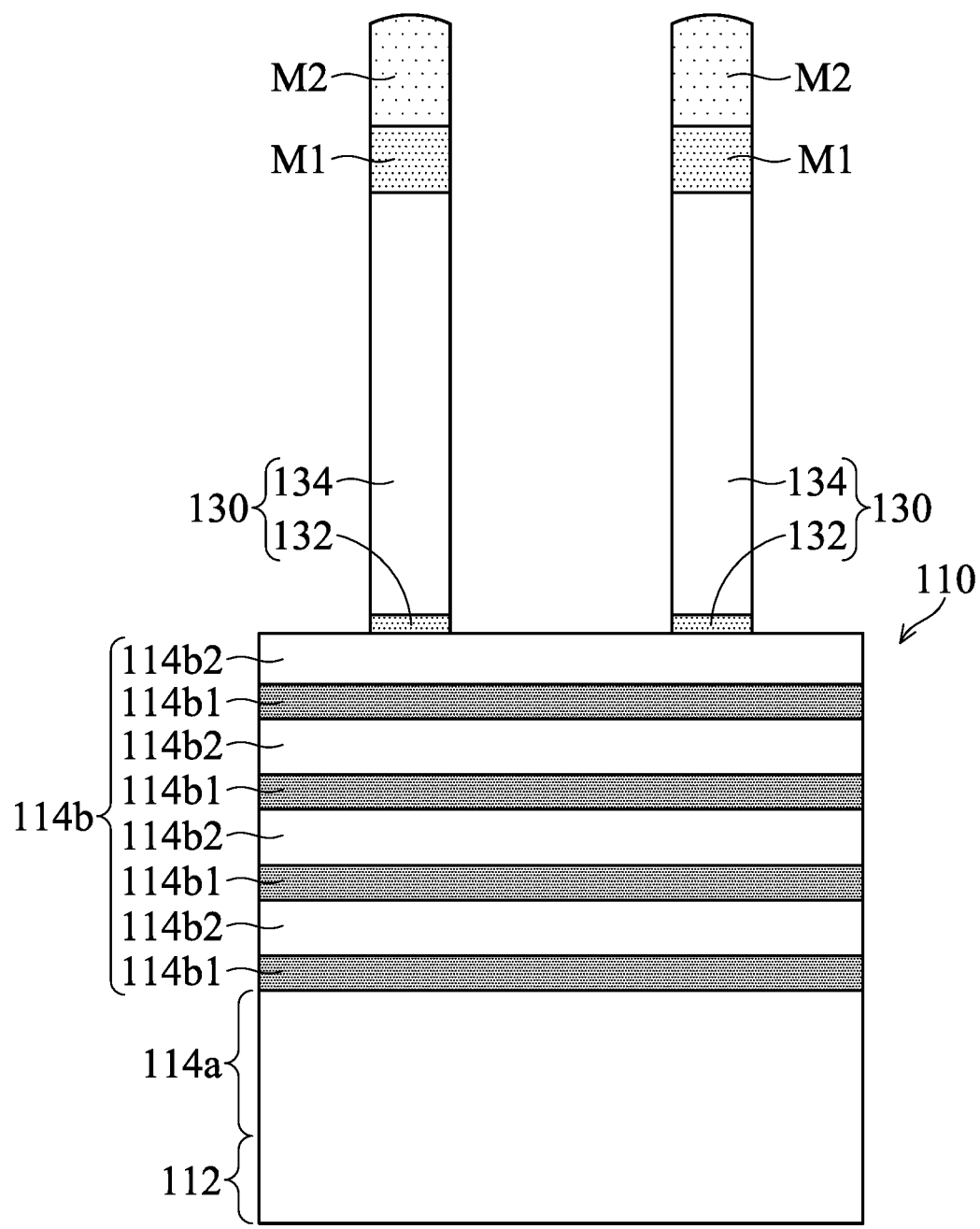

FIGS. 1A-1G are perspective views of various stages of a process for forming a semiconductor device structure, in accordance with some embodiments. FIG. 1A-1 is a cross-sectional view illustrating the semiconductor device structure along a sectional line I-I' in FIG. 1A, in accordance with some embodiments.

As shown in FIGS. 1A and 1A-1, a substrate 110 is provided, in accordance with some embodiments. The substrate 110 has a base 112 and fin structures 114 and 116, in accordance with some embodiments. The base 112 includes, for example, a semiconductor substrate. The semiconductor substrate includes, for example, a semiconductor wafer (such as a silicon wafer) or a portion of a semiconductor wafer. In some embodiments, the base 112 is made of an elementary semiconductor material including silicon or germanium in a single crystal, polycrystal, or amorphous structure.

In some other embodiments, the base 112 is made of a compound semiconductor, such as silicon carbide, gallium arsenide, gallium phosphide, indium phosphide, and/or indium arsenide, an alloy semiconductor, such as SiGe and/or GaAsP, or a combination thereof. The base 112 may also include multi-layer semiconductors, semiconductor on insulator (SOI) (such as silicon on insulator or germanium on insulator), or a combination thereof.

In some embodiments, the base 112 is a device wafer that includes various device elements. In some embodiments, the various device elements are formed in and/or over the base 112. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the base 112. The isolation features are used to define active regions and electrically isolate various device elements formed in and/or over the base 112 in the active regions. In some embodiments, the isolation features include shallow trench isolation (STI) features, local oxidation of silicon (LOCOS) features, other suitable isolation features, or a combination thereof.

The fin structures 114 and 116 are over the base 112, in accordance with some embodiments. The fin structure 114 includes a fin 114a and a multilayer stack 114b, in accordance with some embodiments. The multilayer stack 114b is also referred to as an upper portion of the fin structure 114, in accordance with some embodiments.

The multilayer stack 114b is over the fin 114a, in accordance with some embodiments. The multilayer stack 114b includes sacrificial layers 114b1 and channel layers 114b2, in accordance with some embodiments. The sacrificial layers 114b1 and the channel layers 114b2 are alternately arranged as illustrated in FIG. 1A, in accordance with some embodiments.

It should be noted that, for the sake of simplicity, FIG. 1A shows four layers of the sacrificial layers 114b1 and four layers of the channel layers 114b2 for illustration, but does not limit the invention thereto. In some embodiments, the number of the sacrificial layers 114b1 or the channel layers 114b2 is between 2 and 10.

The sacrificial layers 114b1 are made of a first material, such as a first semiconductor material, in accordance with some embodiments. The channel layers 114b2 are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 114b1 are made of SiGe, and the channel layers 114b2 are made of Si.

In some other embodiments, the sacrificial layers 114b1 or the channel layers 114b2 are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or a combination thereof.

The channel layers 114b2, the fin 114a, and the base 112 are made of the same material such as Si, and the sacrificial layers 114b1 and the fin 114a (or the base 112) are made of different materials, in accordance with some embodiments. In some other embodiments, the sacrificial layers 114b1, the channel layers 114b2, and the fin 114a (or the base 112) are made of different materials, in accordance with some embodiments. The sacrificial layers 114b1 and the channel layers 114b2 are formed using a molecular beam epitaxy (MBE) process, a metal-organic chemical vapor deposition (MOCVD) process, and/or another suitable epitaxial growth process.

The fin structure 116 includes a fin 116a and a multilayer stack 116b, in accordance with some embodiments. The multilayer stack 116b is over the fin 116a, in accordance with some embodiments. The multilayer stack 116b is also referred to as an upper portion of the fin structure 116, in accordance with some embodiments.

The multilayer stack 116b includes sacrificial layers 116b1 and channel layers 116b2, in accordance with some embodiments. The sacrificial layers 116b1 and the channel layers 116b2 are alternately arranged as illustrated in FIG. 1A, in accordance with some embodiments.

It should be noted that, for the sake of simplicity, FIG. 1A shows four layers of the sacrificial layers 116b1 and four layers of the channel layers 116b2 for illustration, but does not limit the invention thereto. In some embodiments, the number of the sacrificial layers 116b1 or the channel layers 116b2 is between 2 and 10.

The sacrificial layers 116b1 are made of a first material, such as a first semiconductor material, in accordance with some embodiments. The channel layers 116b2 are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 116b1 are made of SiGe, and the channel layers 116b2 are made of Si.

In some other embodiments, the sacrificial layers 116b1 or the channel layers 116b2 are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or a combination thereof.

The channel layers 116b2, the fin 116a, and the base 112 are made of the same material such as Si, and the sacrificial layers 116b1 and the fin 116a (or the base 112) are made of different materials, in accordance with some embodiments. In some other embodiments, the sacrificial layers 116b1, the channel layers 116b2, and the fin 116a (or the base 112) are made of different materials, in accordance with some embodiments. The sacrificial layers 114b1 and 116b1 are made of the same material such as SiGe, in accordance with some embodiments. The channel layers 114b2 and 116b2 are made of the same material such as Si, in accordance with some embodiments.

The sacrificial layers 116b1 and the channel layers 116b2 are formed using a molecular beam epitaxy (MBE) process, a metal-organic chemical vapor deposition (MOCVD) process, and/or another suitable epitaxial growth process.

As shown in FIG. 1A, a dielectric layer 120 is formed over the base 112, in accordance with some embodiments. The dielectric layer 120 surrounds the fin structures 114 and 116, in accordance with some embodiments. The dielectric layer 120 is made of oxide (such as silicon oxide), fluorosilicate glass (FSG), a low-k dielectric material, and/or another suitable dielectric material. The dielectric layer 120 may be formed by an atomic layer deposition (ALD) process, a chemical vapor deposition (CVD) process, or another applicable process.

As shown in FIGS. 1A and 1A-1, gate stacks 130 and mask layers M1 and M2 are formed over the fin structures 114 and 116 and the dielectric layer 120, in accordance with some embodiments. The gate stacks 130 are wrapped around upper portions (i.e., the multilayer stacks 114b and 116b) of the fin structures 114 and 116, in accordance with some embodiments.

Each gate stack 130 includes a gate dielectric layer 132 and a gate electrode 134, in accordance with some embodiments. The gate dielectric layer 132, the gate electrode 134, and the mask layers M1 and M2 are sequentially stacked over the fin structures 114 and 116, in accordance with some embodiments.

The gate dielectric layer 132 conformally covers the fin structures 114 and 116 and the dielectric layer 120, in accordance with some embodiments. The gate dielectric layer 132 is made of an insulating material, such as oxide (e.g., silicon oxide), in accordance with some embodiments. The gate electrode 134 is made of a semiconductor material (e.g. polysilicon) or a conductive material (e.g., metal or alloy), in accordance with some embodiments.

The formation of the gate dielectric layer 132 and the gate electrode 134 includes: depositing a gate dielectric material layer (not shown) over the fin structures 114 and 116 and the dielectric layer 120; depositing a gate electrode material layer (not shown) over the gate dielectric material layer; sequentially forming the mask layers M1 and M2 over the gate electrode material layer, wherein the mask layers M1 and M2 expose portions of the gate electrode material layer; and removing the exposed portions of the gate electrode material layer and the gate dielectric material layer thereunder, in accordance with some embodiments.

In some embodiments, the mask layer M1 serves as a buffer layer or an adhesion layer that is formed between the underlying gate electrode 134 and the overlying mask layer M2. The mask layer M1 may also be used as an etch stop layer when the mask layer M2 is removed or etched.

In some embodiments, the mask layer M1 is made of an oxide-containing insulating material (e.g., silicon oxide), a nitride-containing insulating material (e.g., silicon nitride, silicon oxynitride, silicon oxycarbonitride, or silicon carbonitride), an carbon-containing insulating material (e.g., silicon carbide), or a metal oxide material (e.g., aluminum oxide).

In some embodiments, the mask layer M1 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the mask layer M2 is made of an oxide-containing insulating material (e.g., silicon oxide), a nitride-containing insulating material (e.g., silicon nitride, silicon oxynitride, silicon oxycarbonitride, or silicon carbonitride), an carbon-containing insulating material (e.g., silicon carbide), or a metal oxide material (e.g., aluminum oxide). The mask layers M1 and M2 are made of different materials, in accordance with some embodiments.

In some embodiments, the mask layer M2 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the formation of the mask layer M1 and the mask layer M2, the mask layer M1 and the overlying mask layer M2 are patterned by a photolithography process and an etching process, so as to expose the portions of the gate electrode material layer.

Figure 1B:
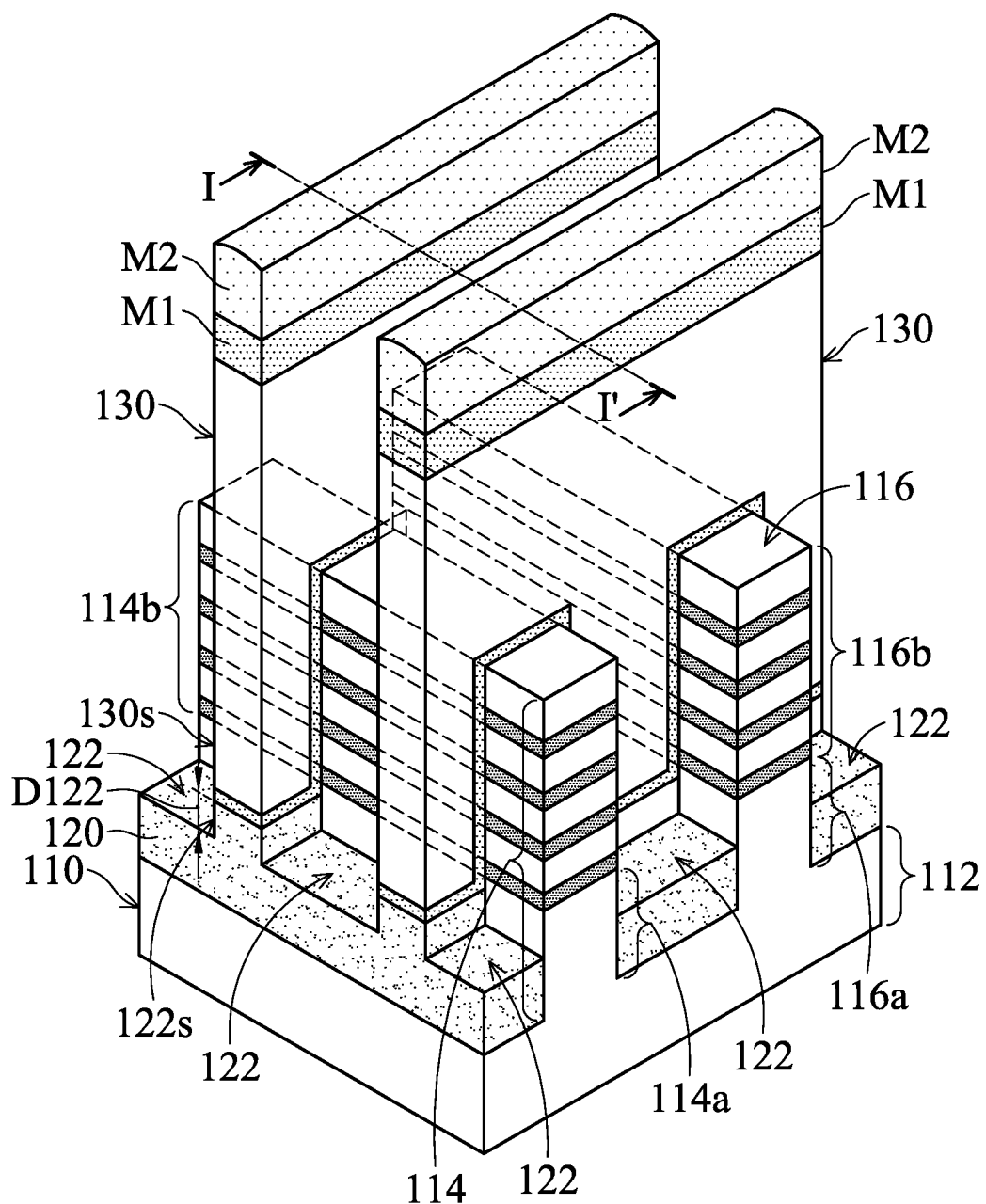
Figures 1, 1B:
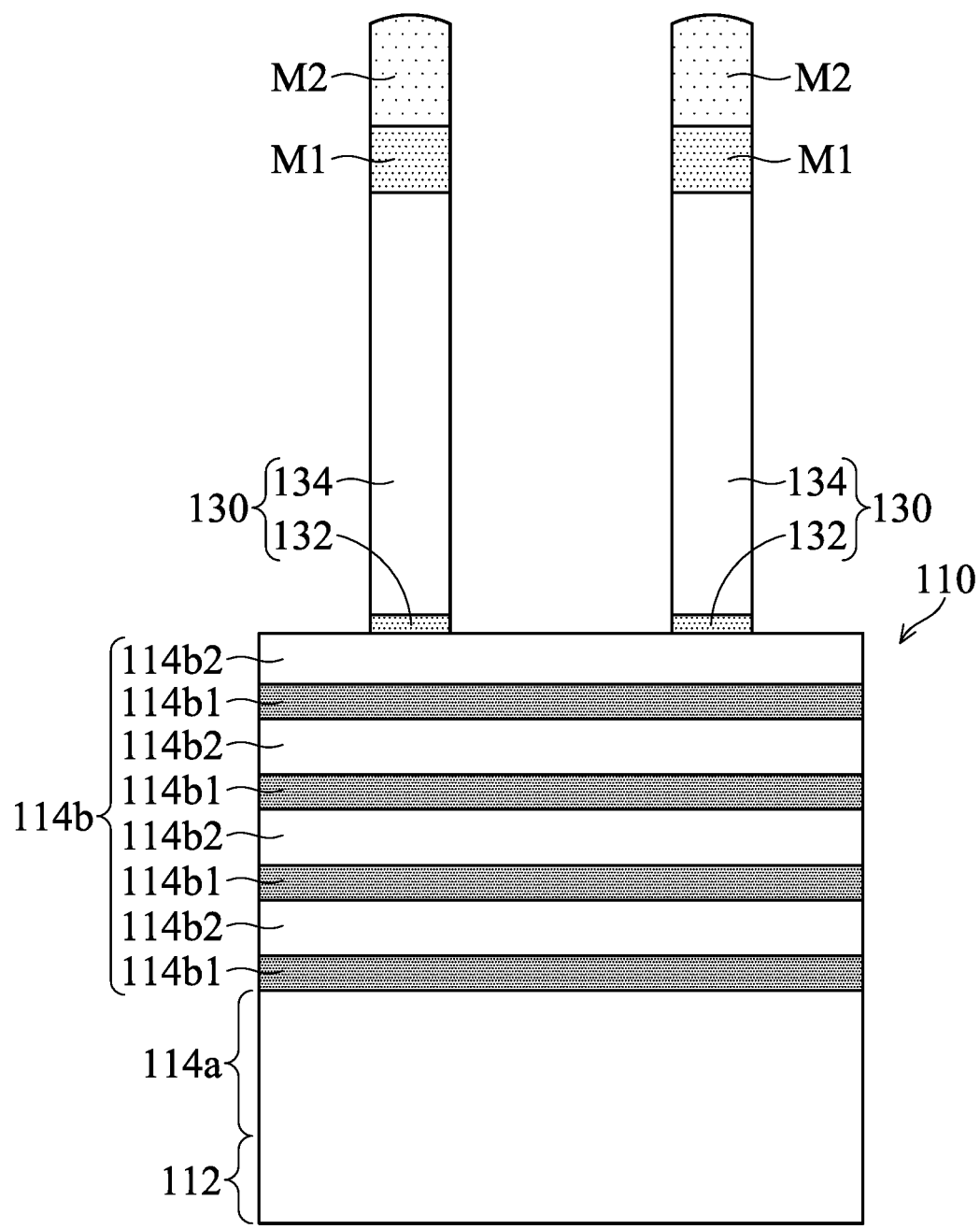

FIG. 1B-1 is a cross-sectional view illustrating the semiconductor device structure along a sectional line I-I' in FIG. 1B, in accordance with some embodiments. As shown in FIGS. 1B and 1B-1, portions of the dielectric layer 120 exposed by the gate stacks 130 are partially removed to form recesses 122 in the dielectric layer 120, in accordance with some embodiments. The portions of the dielectric layer 120 are not covered by the gate stacks 130, in accordance with some embodiments. In some embodiments, a depth D122 of the recess 122 ranges from about 2 nm to about 10 nm.

The inner walls 122s of the recesses 122 are substantially aligned with or substantially level with the sidewalls 130s of the gate stacks 130, in accordance with some embodiments. The removal process includes an etching process, such as an anisotropic etching process, in accordance with some embodiments. The anisotropic etching process includes a dry etching process, such as a plasma etching process, in accordance with some embodiments.

Figure 1C:
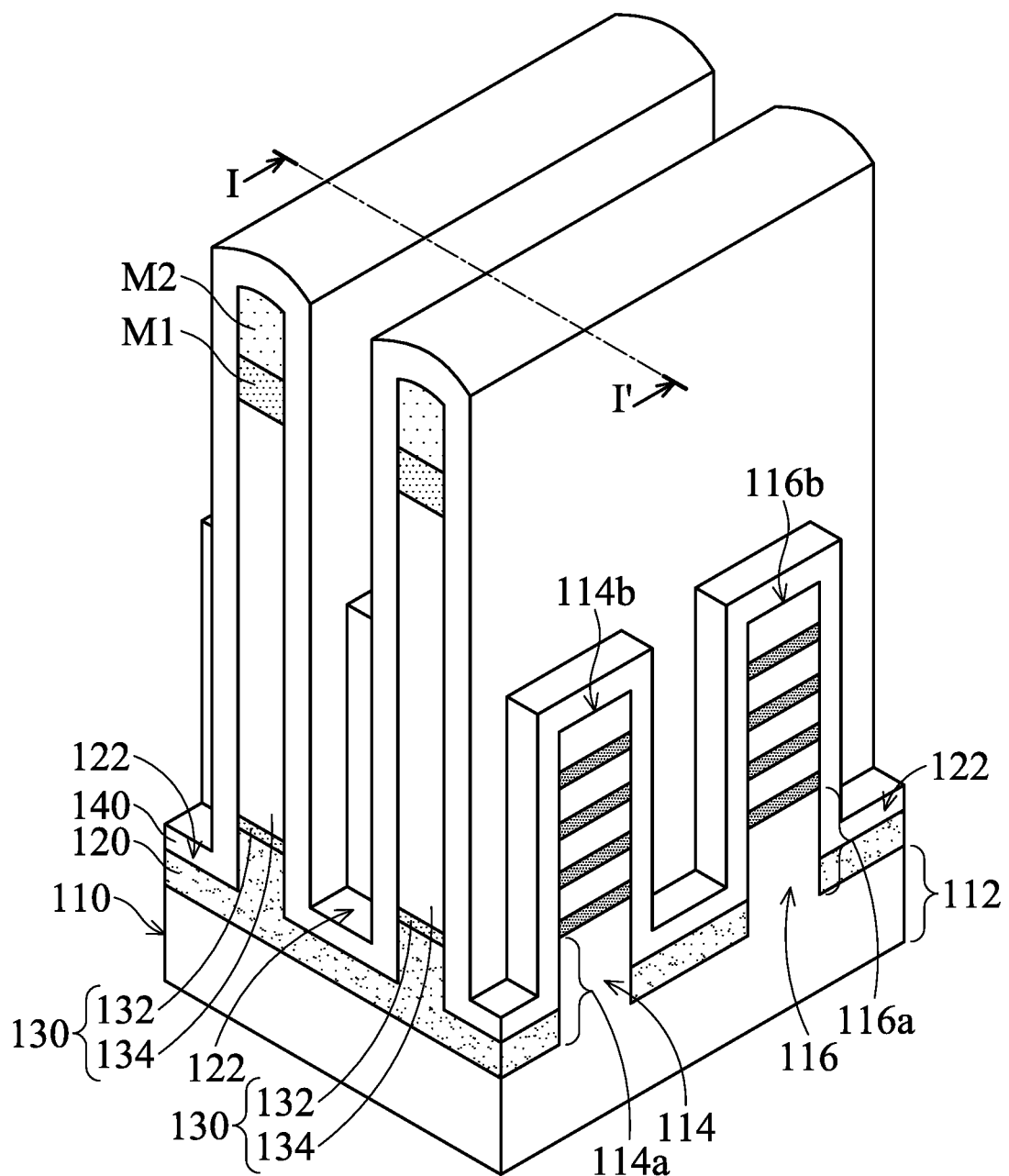
Figures 1, 1C:
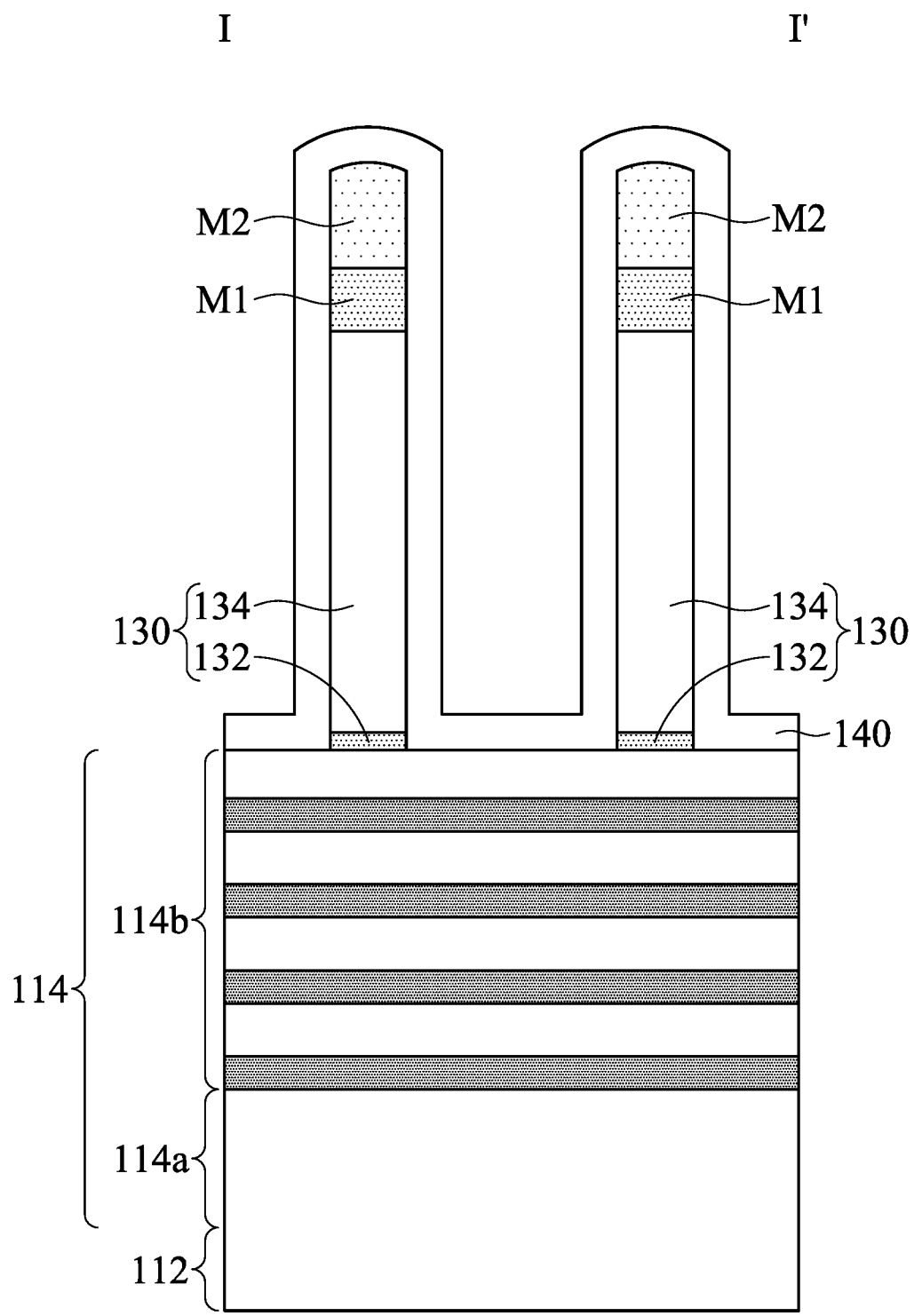

FIG. 1C-1 is a cross-sectional view illustrating the semiconductor device structure along a sectional line I-I' in FIG. 1C, in accordance with some embodiments. As shown in FIGS. 1C and 1C-1, a spacer layer 140 is conformally formed over the fin structures 114 and 116, the dielectric layer 120, the gate stacks 130, and the mask layers M1 and M2, in accordance with some embodiments.

In some embodiments, as shown in FIG. 1C, the spacer layer 140 is a single-layered structure. In some other embodiments (not shown), the spacer layer 140 is a multi-layered structure. The spacer layer 140 includes layers, in accordance with some embodiments. The layers are made of different materials, in accordance with some embodiments.

In some embodiments, the spacer layer 140 is made of a nitride-containing insulating material or a carbon-containing insulating material, in accordance with some embodiments. The spacer layer 140 is made of silicon nitride (SiN), silicon oxynitride (SiON), silicon oxycarbide (SiOC), silicon oxycarbonitride (SiOCN), or silicon carbonitride (SiCN), in accordance with some embodiments.

The spacer layer 140 is formed using a deposition process, such as a chemical vapor deposition (CVD) process, an atomic layer deposition (ALD) process, or a physical vapor deposition (PVD) process, in accordance with some embodiments.

Figure 1D:
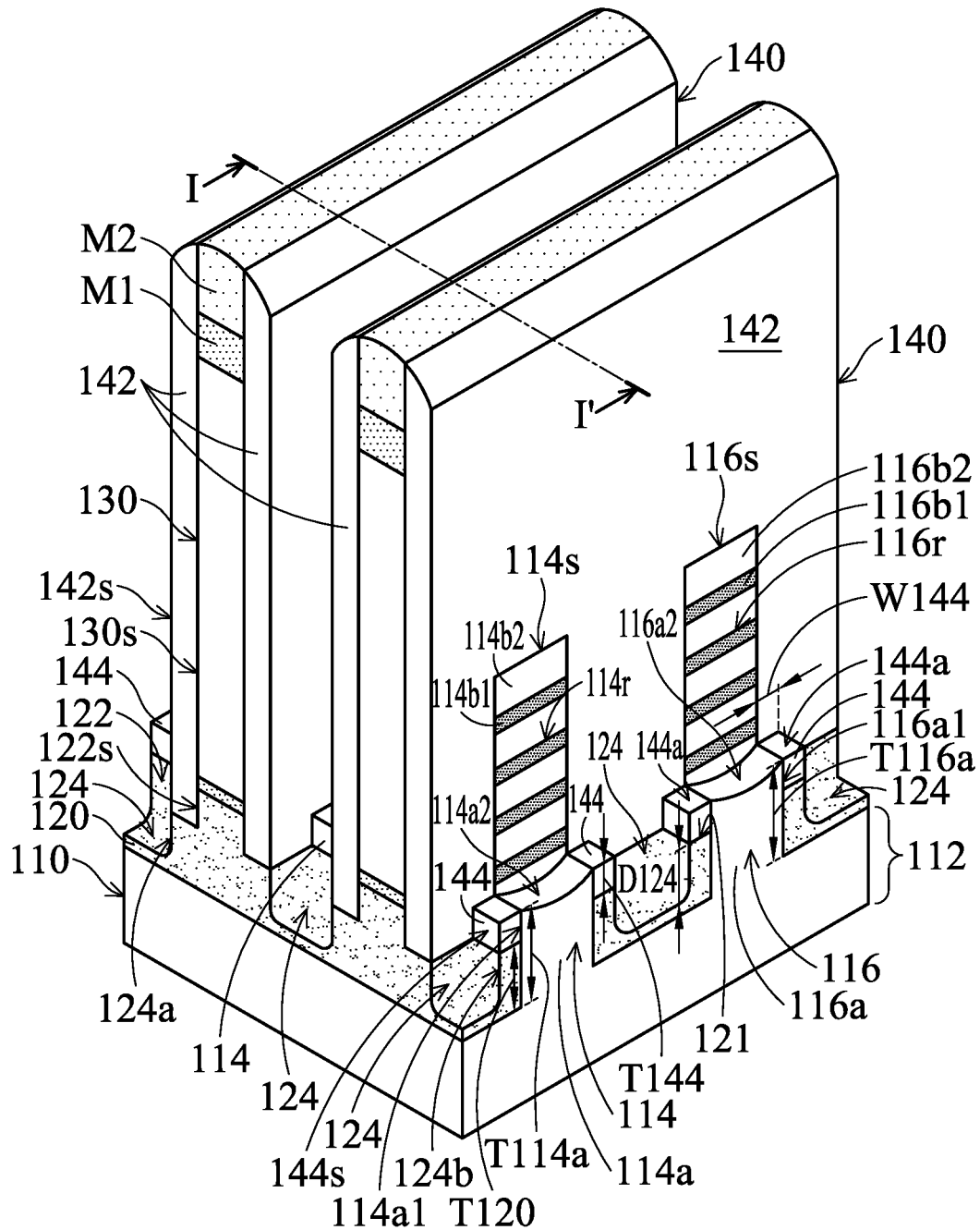
Figures 1, 1D:
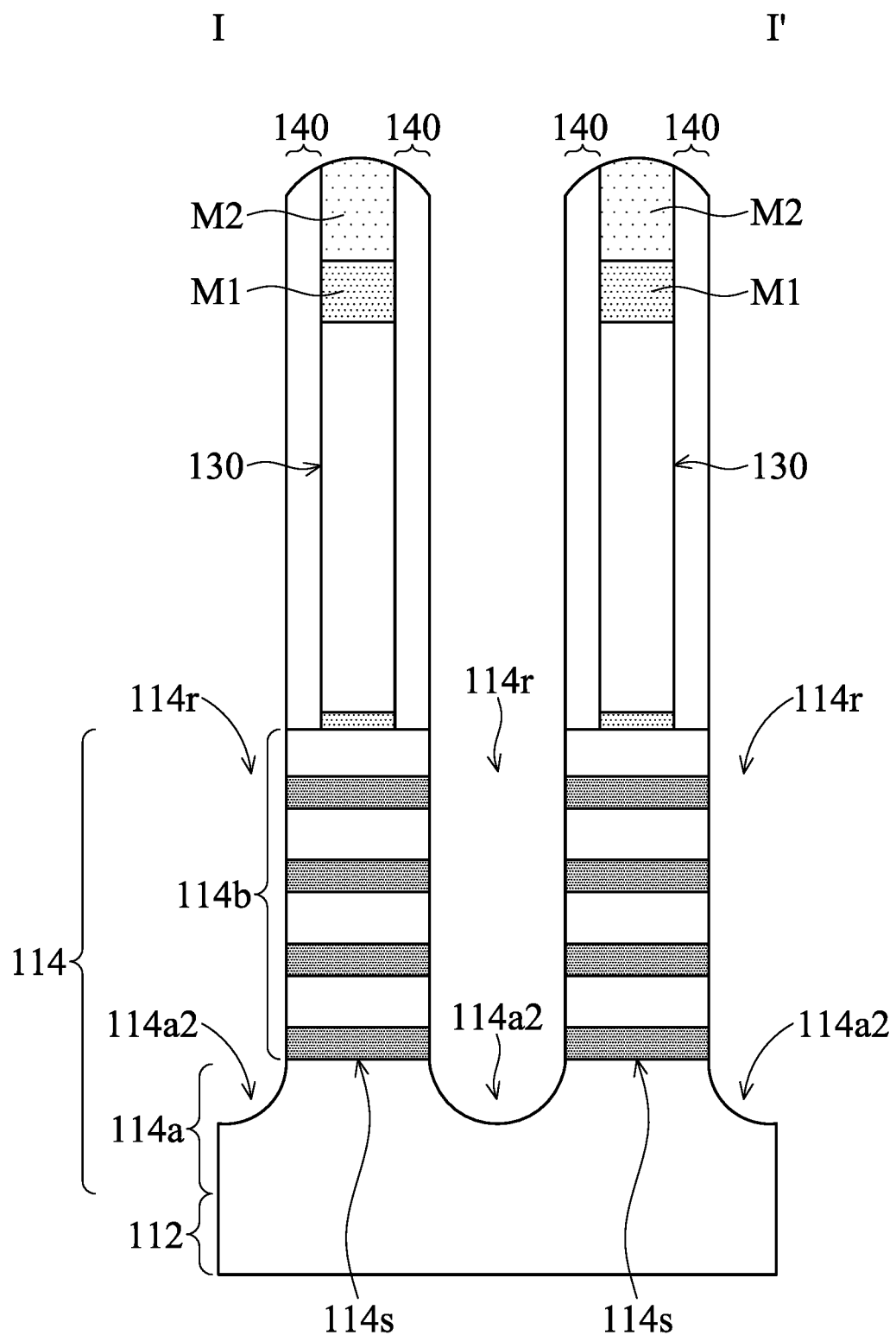

FIG. 1D-1 is a cross-sectional view illustrating the semiconductor device structure along a sectional line I-I' in FIG. 1D, in accordance with some embodiments. As shown in FIGS. 1C, 1D, and 1D-1, portions of the spacer layer 140 and the multilayer stacks 114b and 116b, which are not covered by the gate stacks 130 and the spacer layer 140 over the sidewalls 130s of the gate stacks 130, are removed, in accordance with some embodiments.

The removed portions of the spacer layer 140 are over top surfaces of the gate stacks 130, the fin structures 114 and 116, and the dielectric layer 120, in accordance with some embodiments. The removal process further partially removes the dielectric layer 120, which is not covered by the spacer layer 140 and the gate stacks 130, to form recesses 124 in the dielectric layer 120, in accordance with some embodiments.

After the removal process, the spacer layer 140 remains over opposite sidewalls of the gate stacks 130, opposite sidewalls of the mask layers M1 and M2, and the opposite sidewalls 114a1 and 116a1 of the fins 114a and 116a of the fin structures 114 and 116, in accordance with some embodiments.

The spacer layer 140 remaining over the opposite sidewalls 130s of the gate stacks 130 and the opposite sidewalls of the mask layers M1 and M2 forms spacers 142, in accordance with some embodiments. The spacer layer 140 remaining over the opposite sidewalls 114a1 and 116a1 of the fins 114a and 116a of the fin structures 114 and 116 forms spacers 144, in accordance with some embodiments.

As shown in FIG. 1D, inner walls 124a of the recesses 124 are substantially aligned with or substantially level with the sidewalls 142s of the spacers 142 thereover, in accordance with some embodiments. The inner walls 124a are also referred to as sidewalls of the dielectric layer 120, in accordance with some embodiments.

As shown in FIG. 1D, inner walls 124b of the recesses 124 are substantially aligned with or substantially level with the sidewalls 144s of the spacers 144 thereover, in accordance with some embodiments. The inner walls 124b are also referred to as sidewalls of the dielectric layer 120, in accordance with some embodiments.

As shown in FIG. 1D, a depth D124 of the recess 124 is greater than a thickness T144 of the spacer 144, in accordance with some embodiments. The depth D124 ranges from about 5 nm to about 60 nm, in accordance with some embodiments. In some embodiments, a ratio of the thickness T144 to the depth D124 ranges from about 0.05 to about 0.3.

The thickness T144 ranges from about 2 nm to about 10 nm, in accordance with some embodiments. If the thickness T144 is less than 2 nm, the spacers 144 peel off easily and is easily etched off during the removal process for removing the portions of the spacer layer 140 and the multilayer stacks 114b and 116b, in accordance with some embodiments.

If the thickness T144 is greater than 10 nm and the sum of the thickness T120 of the dielectric layer 120 and the thickness T144 of the spacer 144 is fixed, the dielectric layer 120 is too thin, in accordance with some embodiments. A width W144 of the spacer 144 ranges from about 2 nm to about 5 nm, in accordance with some embodiments.

As shown in FIG. 1D, an upper surface 114a2 of the fin 114a of the fin structure 114, which is not covered by the gate stacks 130 and the spacers 142 and 144, is higher than a top surface 121 of the dielectric layer 120, in accordance with some embodiments. As shown in FIG. 1D, an upper surface 116a2 of the fin structure 116, which is not covered by the gate stack 130 and the spacers 142 and 144, is higher than the top surface 121 of the dielectric layer 120, in accordance with some embodiments.

The (maximum) thickness T114a of the fin 114a of the fin structure 114, which is not covered by the gate stack 130 and the spacers 142 and 144, is substantially equal to a sum of the thickness T120 of the dielectric layer 120 and the thickness T144 of the spacer 144, in accordance with some embodiments.

The (maximum) thickness T116a of the fin 116a of the fin structure 116, which is not covered by the gate stack 130 and the spacers 142 and 144, is substantially equal to a sum of the thickness T120 of the dielectric layer 120 and the thickness T144 of the spacer 144, in accordance with some embodiments.

As shown in FIG. 1D, the spacers 142 cover the inner walls 122s of the recesses 122 of the dielectric layer 120, in accordance with some embodiments. The inner walls 122s are also referred to as sidewalls of the dielectric layer 120, in accordance with some embodiments.

As shown in FIG. 1D, a top surface 144a of the spacer 144 is substantially level with (or substantially aligned with) the upper surface 114a2 of the fin 114a of the fin structure 114, in accordance with some embodiments. The top surface 144a of the spacer 144 is substantially level with (or substantially aligned with) the upper surface 116a2 of the fin 116a of the fin structure 116, in accordance with some embodiments.

The spacer 144 is thinner than the dielectric layer 120, in accordance with some embodiments. The upper surface 114a2 of the fin structure 114 is a concave upper surface, in accordance with some embodiments. The upper surface 116a2 of the fin structure 116 is a concave upper surface, in accordance with some embodiments.

The removal process forms recesses 114r and 116r in the fin structures 114 and 116 respectively, in accordance with some embodiments. The multilayer structure 114b is divided into multilayer stacks 114s by the recesses 114r, in accordance with some embodiments. Each multilayer stack 114s includes four layers of the sacrificial layers 114b1 and four layers of the channel layers 114b2, in accordance with some embodiments.

The multilayer structure 116b is divided into multilayer stacks 116s by the recesses 116r, in accordance with some embodiments. Each multilayer stack 116s includes four layers of the sacrificial layers 116b1 and four layers of the channel layers 116b2, in accordance with some embodiments. The removal process for forming the recesses 114r and 116r includes an etching process, such as an anisotropic etching process (e.g., a dry etching process), in accordance with some embodiments.

Figure 1E:
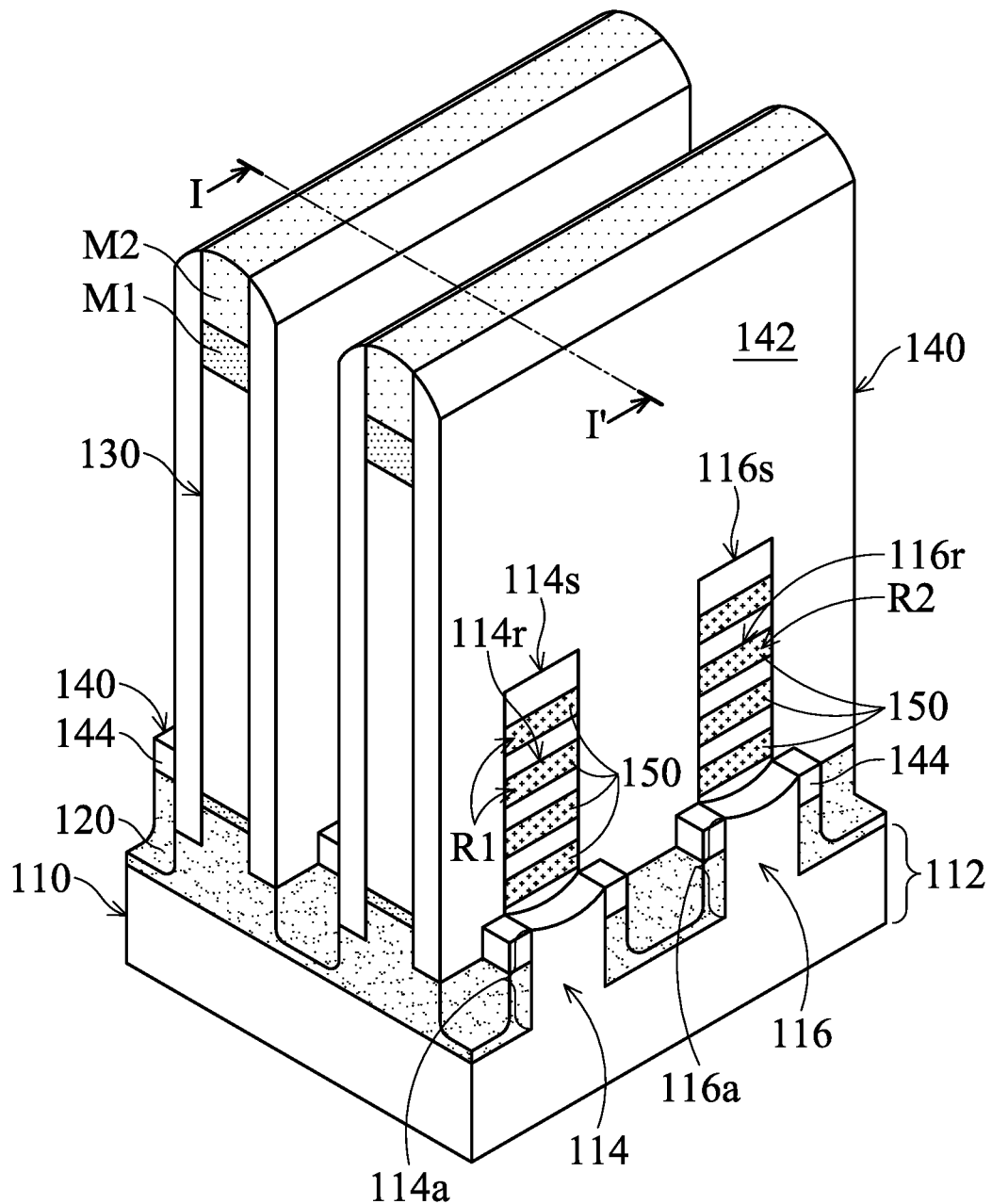
Figures 1, 1E:
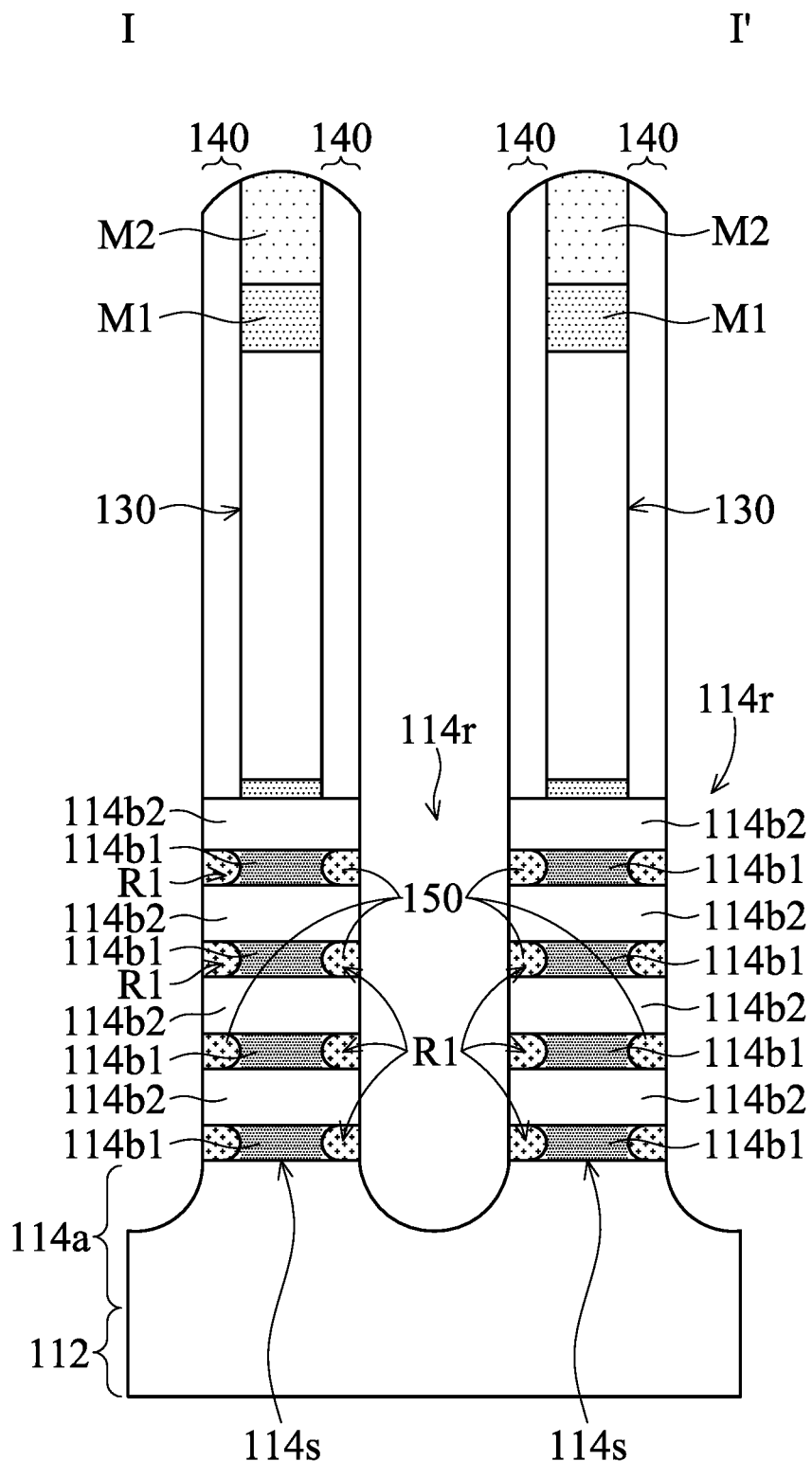

FIG. 1E-1 is a cross-sectional view illustrating the semiconductor device structure along a sectional line I-I' in FIG. 1E, in accordance with some embodiments. As shown in FIGS. 1E and 1E-1, portions of the sacrificial layers 114b1 are removed to form recesses R1 in the multilayer stacks 114s, in accordance with some embodiments. The recess R1 is surrounded by the corresponding sacrificial layer 114b1 and the corresponding channel layers 114b2, in accordance with some embodiments.

As shown in FIGS. 1D and 1E, portions of the sacrificial layers 116b1 are removed from sidewalls of the sacrificial layers 116b1 to form recesses R2 in the multilayer stacks 116s, in accordance with some embodiments. The removal process includes an etching process, such as an isotropic etching process (e.g., a dry etching process or a wet etching process), in accordance with some embodiments.

As shown in FIGS. 1E and 1E-1, an inner spacer layer 150 is formed in the recesses R1 and R2, in accordance with some embodiments. In some embodiments, the inner spacer layer 150 is made of an oxide-containing insulating material, such as silicon oxide.

In some other embodiments, the inner spacer layer 150 is made of a nitride-containing insulating material, such as silicon nitride (SiN), silicon oxynitride (SiON), silicon oxycarbonitride (SiOCN), or silicon carbonitride (SiCN). The inner spacer layer 150 is formed using a deposition process, such as a chemical vapor deposition process or a physical vapor deposition process, in accordance with some embodiments.

Figure 1F:
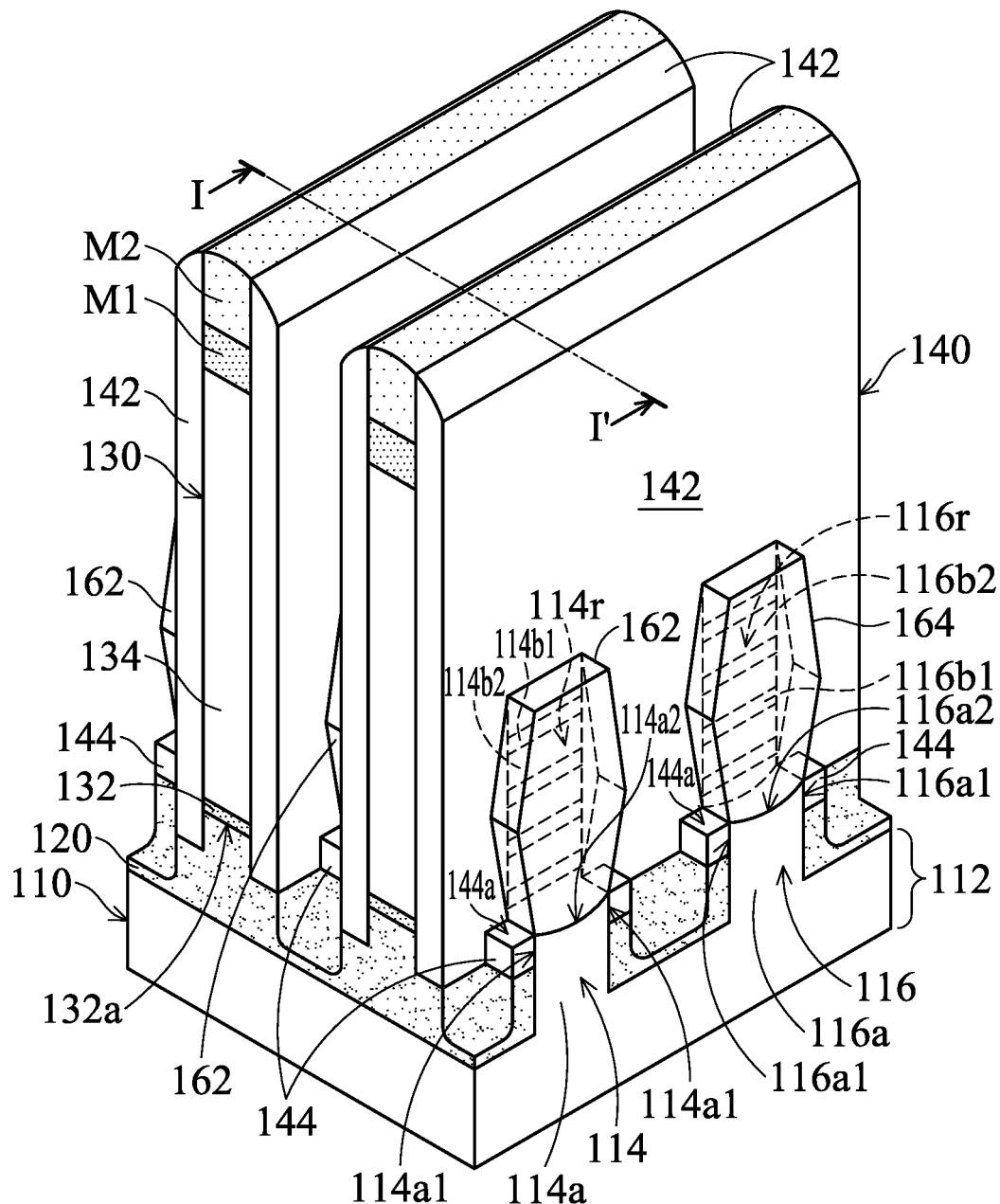
Figures 1, 1F:
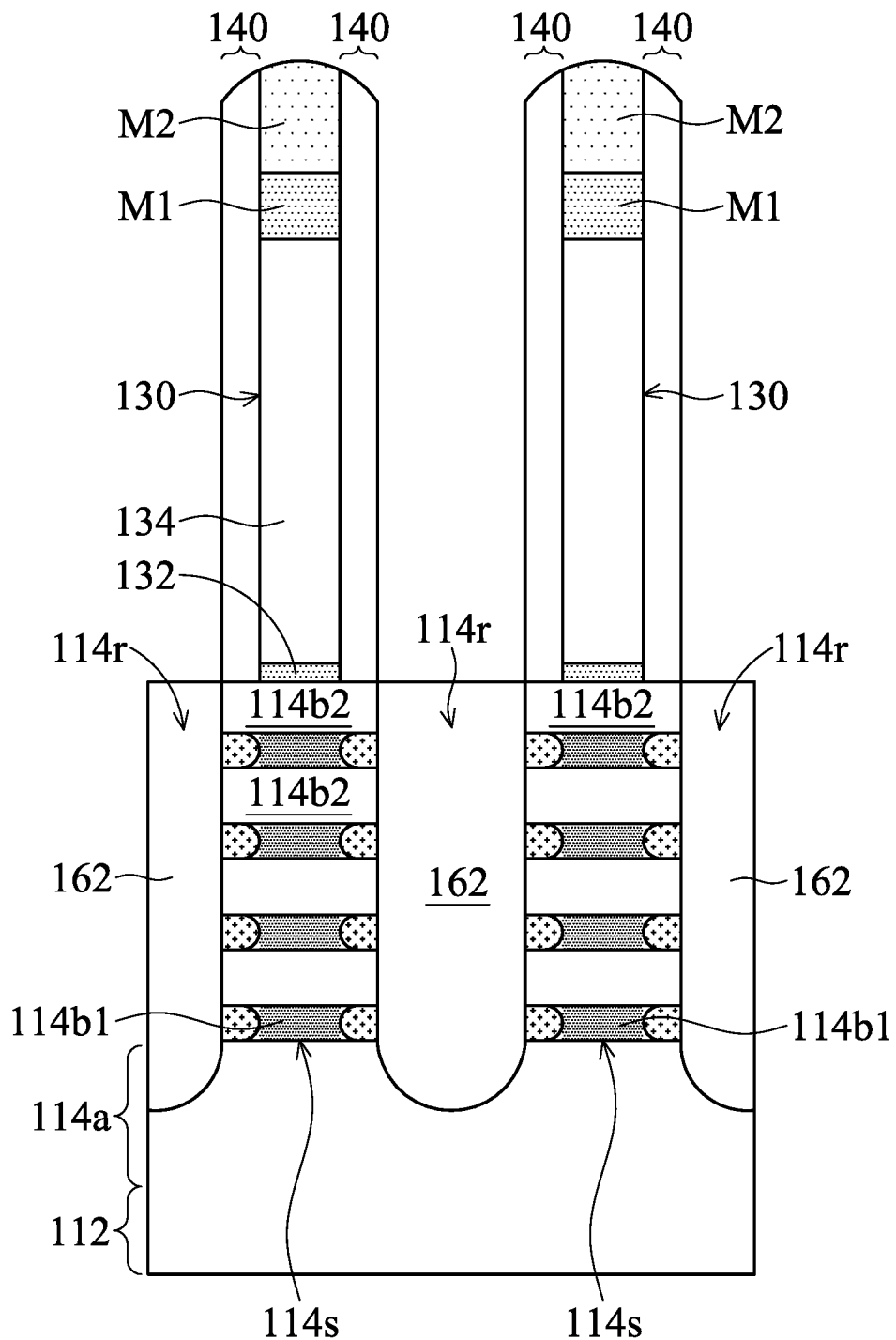

FIG. 1F-1 is a cross-sectional view illustrating the semiconductor device structure along a sectional line I-I' in FIG. 1F, in accordance with some embodiments. As shown in FIGS. 1F and 1F-1, source/drain structures 162 and 164 are respectively formed over the fins 114a and 116a of the fin structures 114 and 116, in accordance with some embodiments.

As shown in FIGS. 1F and 1F-1, the source/drain structures 162 are in the corresponding recesses 114r, in accordance with some embodiments. The source/drain structures 162 are in direct contact with the fin 114a, in accordance with some embodiments. Each source/drain structure 162 is above the corresponding spacers 144, in accordance with some embodiments. Each source/drain structure 162 is in direct contact with the spacers 144 thereunder, in accordance with some embodiments.

The source/drain structures 164 are in the corresponding recesses 116r, in accordance with some embodiments. The source/drain structures 164 are in direct contact with the fin 116a, in accordance with some embodiments. Each source/drain structure 164 is above the corresponding spacers 144, in accordance with some embodiments. Each source/drain structure 164 is in direct contact with the spacers 144 thereunder, in accordance with some embodiments.

As shown in FIG. 1F, the upper surface 114a2 of the fin 114a or the upper surface 116a2 of the fin 116a is substantially level with (or aligned with) a bottom surface 132a of the gate dielectric layer 132, in accordance with some embodiments.

Since the spacers 144 cover the opposite sidewalls 114a1 and 116a1 of the fins 114a and 116a of the fin structures 114 and 116, the spacers 144 are able to prevent the source/drain structures 162 and 164 from forming over the sidewalls 114a1 and 116a1, in accordance with some embodiments. Therefore, the spacers 144 are able to constrain the size (e.g., the width) of the source/drain structures 162 and 164 to avoid that the source/drain structures 162 and 164 are merged with each other, in accordance with some embodiments. Therefore, the yield of the source/drain structures 162 and 164 is improved, in accordance with some embodiments.

In some embodiments, the source/drain structures 162 are made of a semiconductor material (e.g., silicon germanium) with P-type dopants, such as the Group IIIA element, in accordance with some embodiments. The Group IIIA element includes boron or another suitable material.

In some other embodiments, the source/drain structures 164 are made of a semiconductor material (e.g., silicon) with N-type dopants, such as the Group VA element, in accordance with some embodiments. The Group VA element includes phosphor (P), antimony (Sb), or another suitable Group VA material. The source/drain structures 162 and 164 are formed using an epitaxial process, in accordance with some embodiments.

The source/drain structures 162 and 164 are made of different materials, in accordance with some embodiments. Therefore, the source/drain structures 162 and 164 are formed using different epitaxial growth processes, in accordance with some embodiments.

For example, the formation of the source/drain structures 162 and 164 includes forming a first mask layer (not shown) over the fin 116a of the fin structure 116; forming the source/drain structures 162 over the fin 114a of the fin structure 114; removing the first mask layer; forming a second mask layer (not shown) over the source/drain structures 162; forming the source/drain structures 164 over the fin 116a of the fin structure 116; and removing the second mask layer.

Figure 1G:
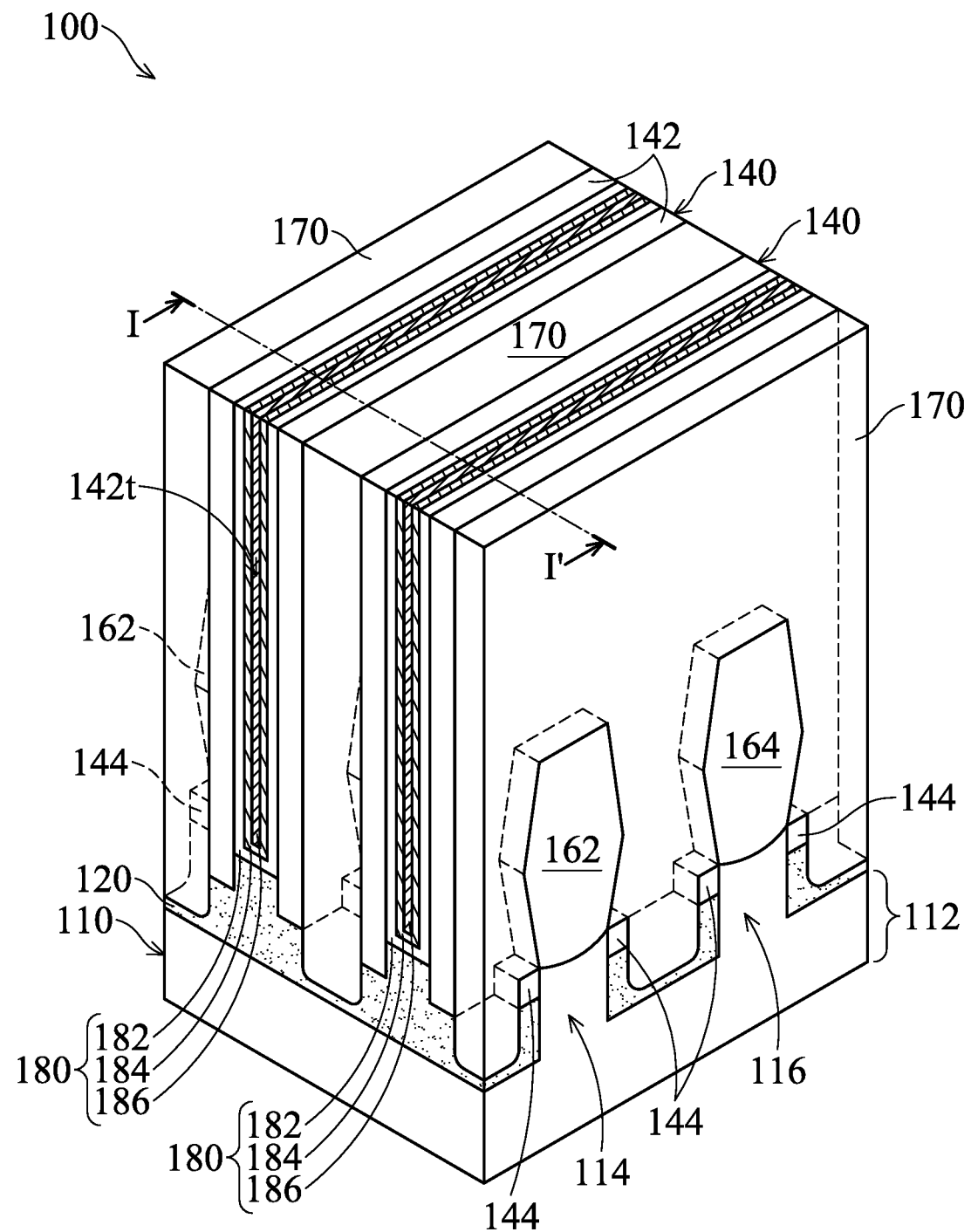
Figures 1, 1G:
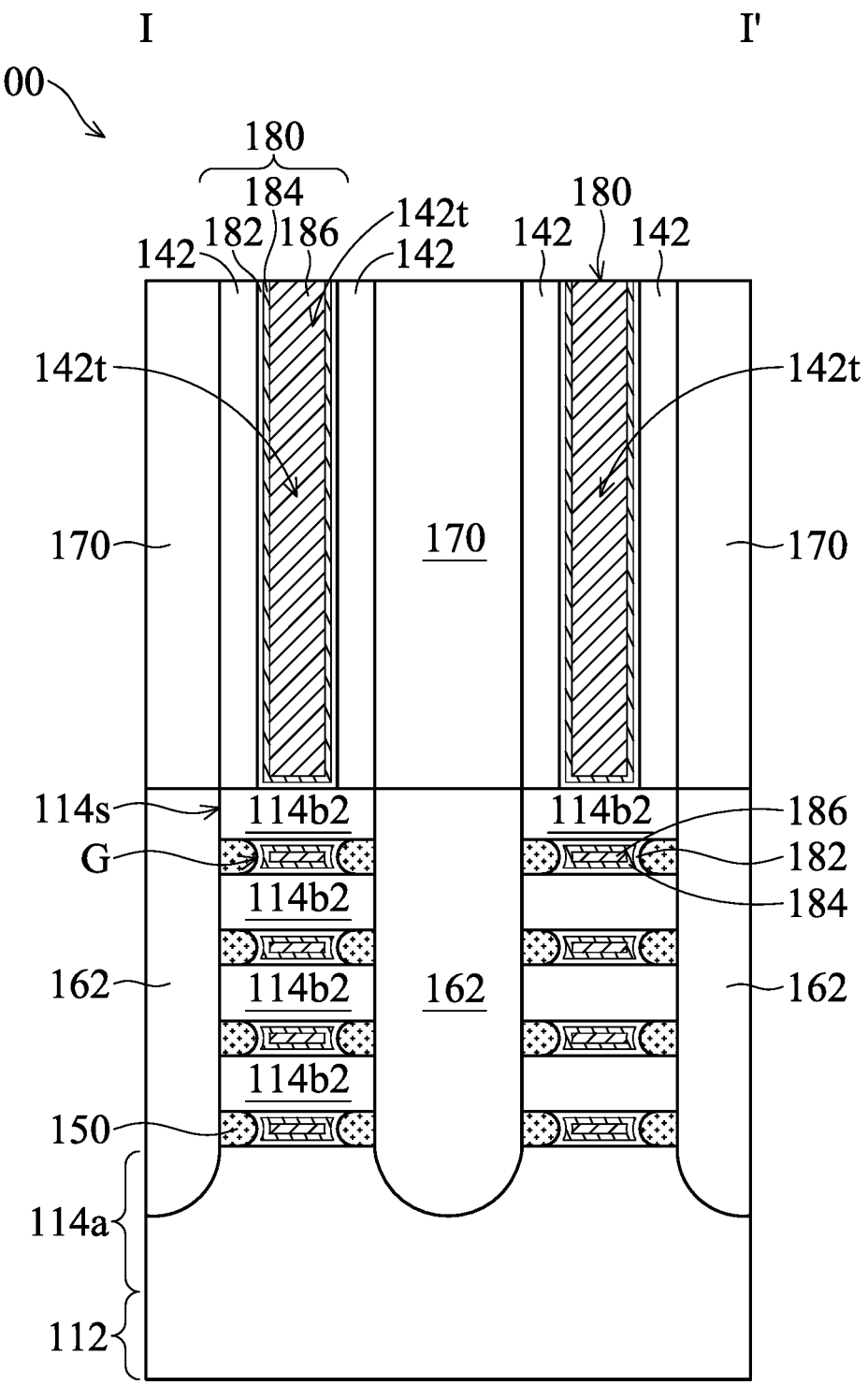

FIG. 1G-1 is a cross-sectional view illustrating the semiconductor device structure along a sectional line I-I' in FIG. 1G, in accordance with some embodiments. As shown in FIGS. 1F, 1G and 1G-1, a dielectric layer 170 is formed over the source/drain structures 162 and 164, the spacer layer 140, and the mask layers M1 and M2, in accordance with some embodiments.

The dielectric layer 170 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

As shown in FIGS. 1G and 1G-1, top portions of the dielectric layer 170 and the spacer layer 140, and the mask layers M1 and M2 are removed, in accordance with some embodiments. The removal process includes a planarization process, such as a chemical mechanical polishing process, in accordance with some embodiments.

As shown in FIGS. 1F, 1G and 1G-1, the gate electrodes 134 are removed to form trenches 142t in the spacers 142, in accordance with some embodiments. The removal process includes an etching process, such as a wet etching process or a dry etching process, in accordance with some embodiments.

As shown in FIGS. 1F, 1G, and 1G-1, the gate dielectric layers 132 are removed through the trenches 142t, in accordance with some embodiments. The removal process includes an etching process, such as a wet etching process or a dry etching process, in accordance with some embodiments.

As shown in FIGS. 1F, 1F-1, 1G, and 1G-1, the sacrificial layers 114b1 and 116b1 are removed through the trenches 142t, in accordance with some embodiments. The removal process includes an etching process, such as a wet etching process or a dry etching process, in accordance with some embodiments.

As shown in FIGS. 1G and 1G-1, gate stacks 180 are formed in the trenches 142t, in accordance with some embodiments. Each gate stack 180 includes a gate dielectric layer 182, a work function layer 184, and a gate electrode layer 186, in accordance with some embodiments.

As shown in FIGS. 1F, 1G and 1G-1, the gate dielectric layer 182, the work function layer 184, and the gate electrode layer 186 are sequentially stacked over the channel layers 114b2 and 116b2, in accordance with some embodiments. The gate stack 180 wraps around the channel layers 114b2 and 116b2, in accordance with some embodiments. The inner spacer layer 150 electrically insulates the source/drain structures 162 and 164 from the gate stacks 180, in accordance with some embodiments. In this step, a semiconductor device structure 100 is substantially formed, in accordance with some embodiments.

Figure 2A:
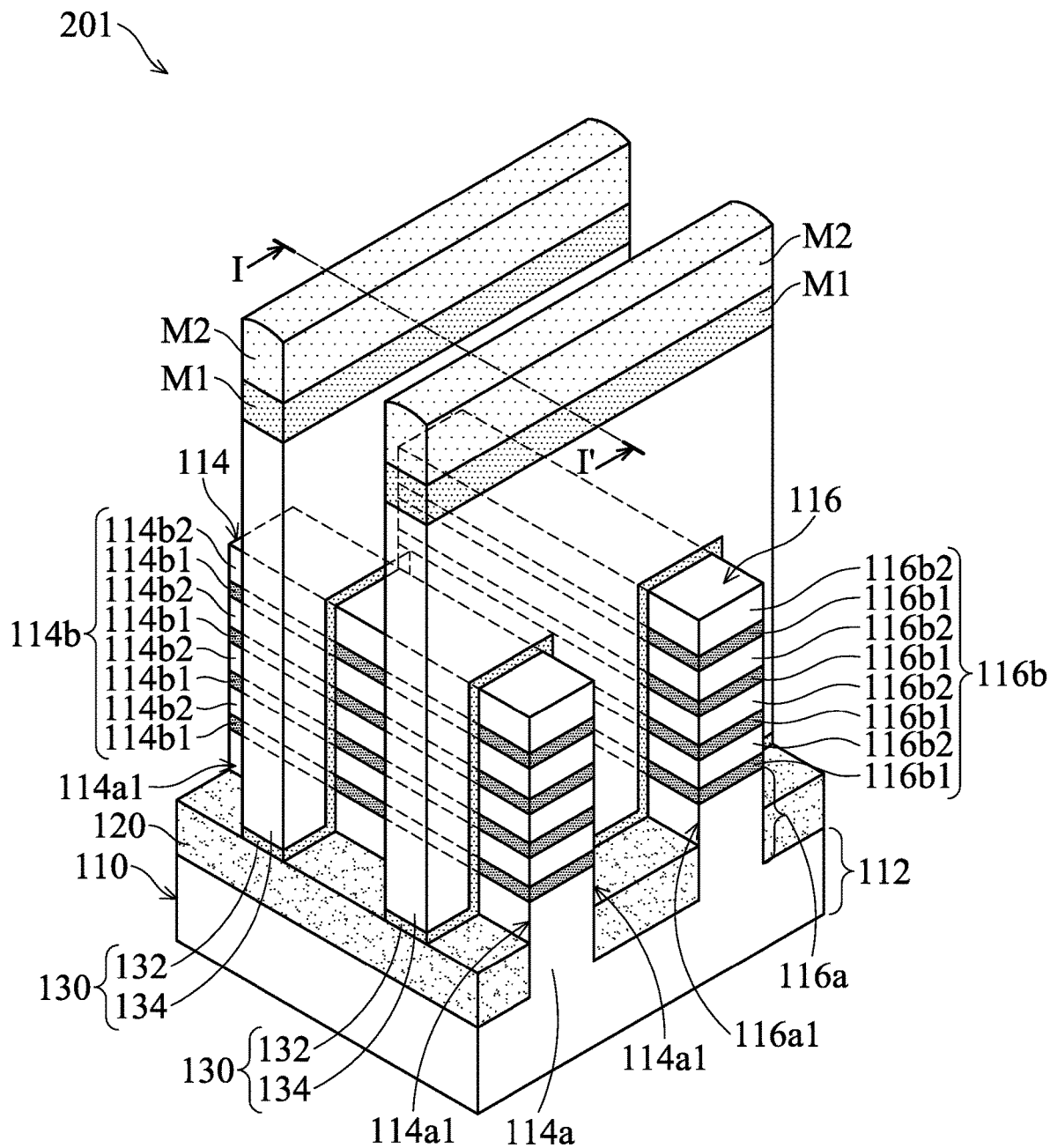
FIGS. 2A-2F are perspective views of various stages of a process for forming a semiconductor device structure, in accordance with some embodiments.
Figures 1, 2A:
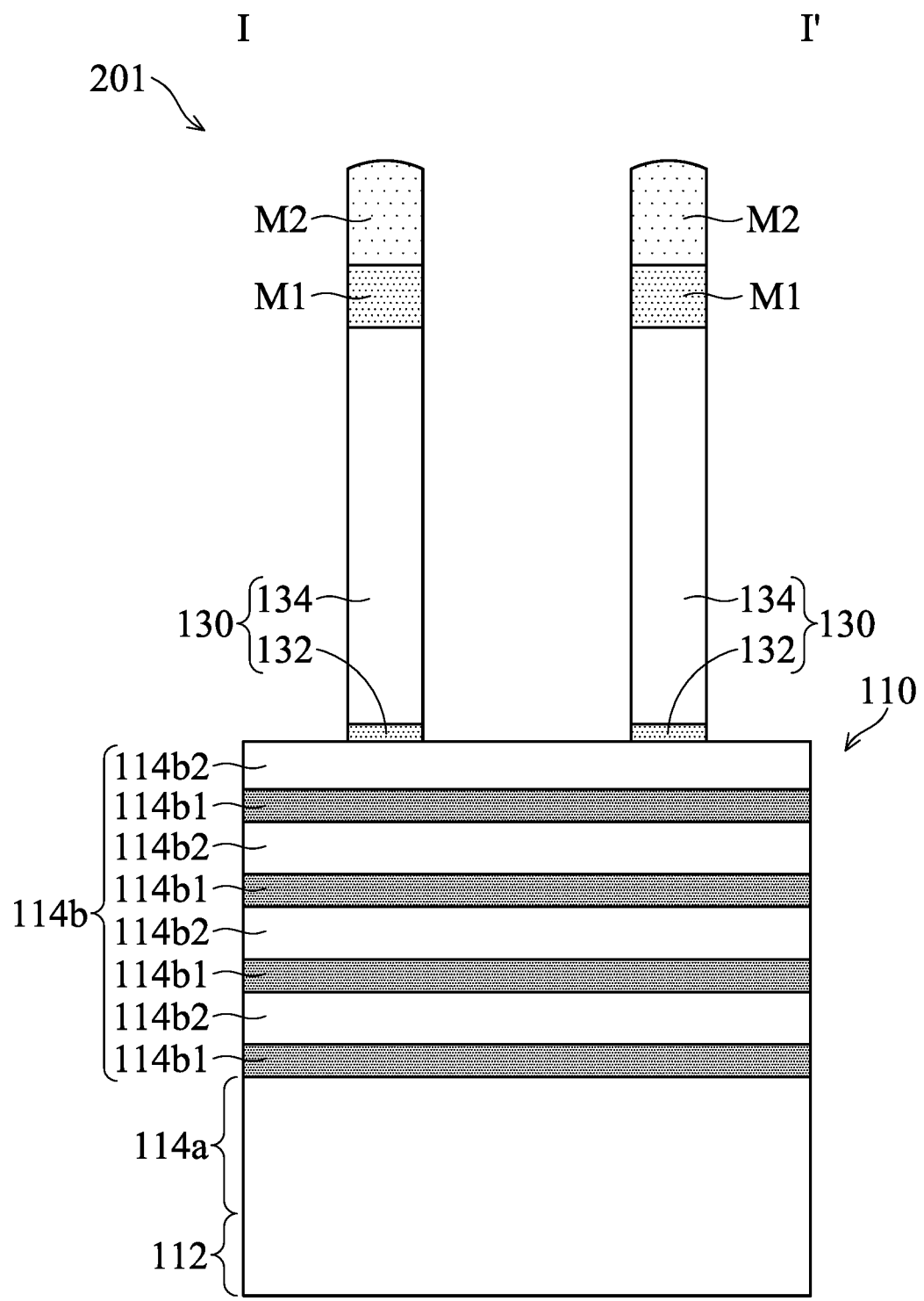

FIGS. 2A-2F are perspective views of various stages of a process for forming a semiconductor device structure, in accordance with some embodiments. FIG. 2A-1 is a cross-sectional view illustrating the semiconductor device structure along a sectional line I-I' in FIG. 2A, in accordance with some embodiments. As shown in FIGS. 2A and 2A-1, a semiconductor device structure 201 is provided, in accordance with some embodiments.

The semiconductor device structure 201 is similar to the semiconductor device structure of FIG. 1A, except that the dielectric layer 120 of the semiconductor device structure 201 is thinner than that of the semiconductor device structure of FIG. 1A, in accordance with some embodiments. Therefore, the gate stacks 130 cover more portions of the sidewalls 114a1 and 116a1 of the fins 114a and 116a of the fin structures 114 and 116, in accordance with some embodiments.

Figure 2B:
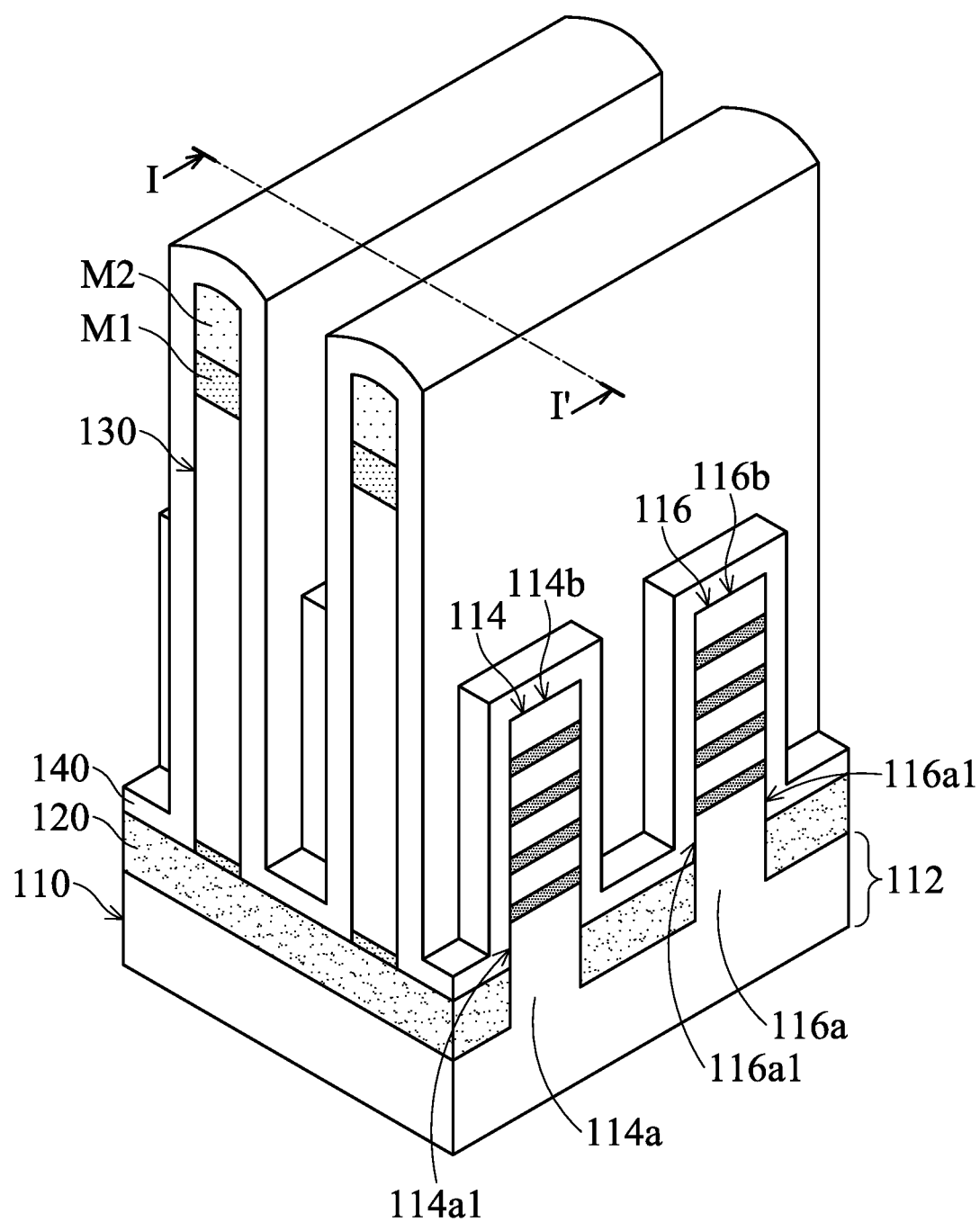
Figures 1, 2B:
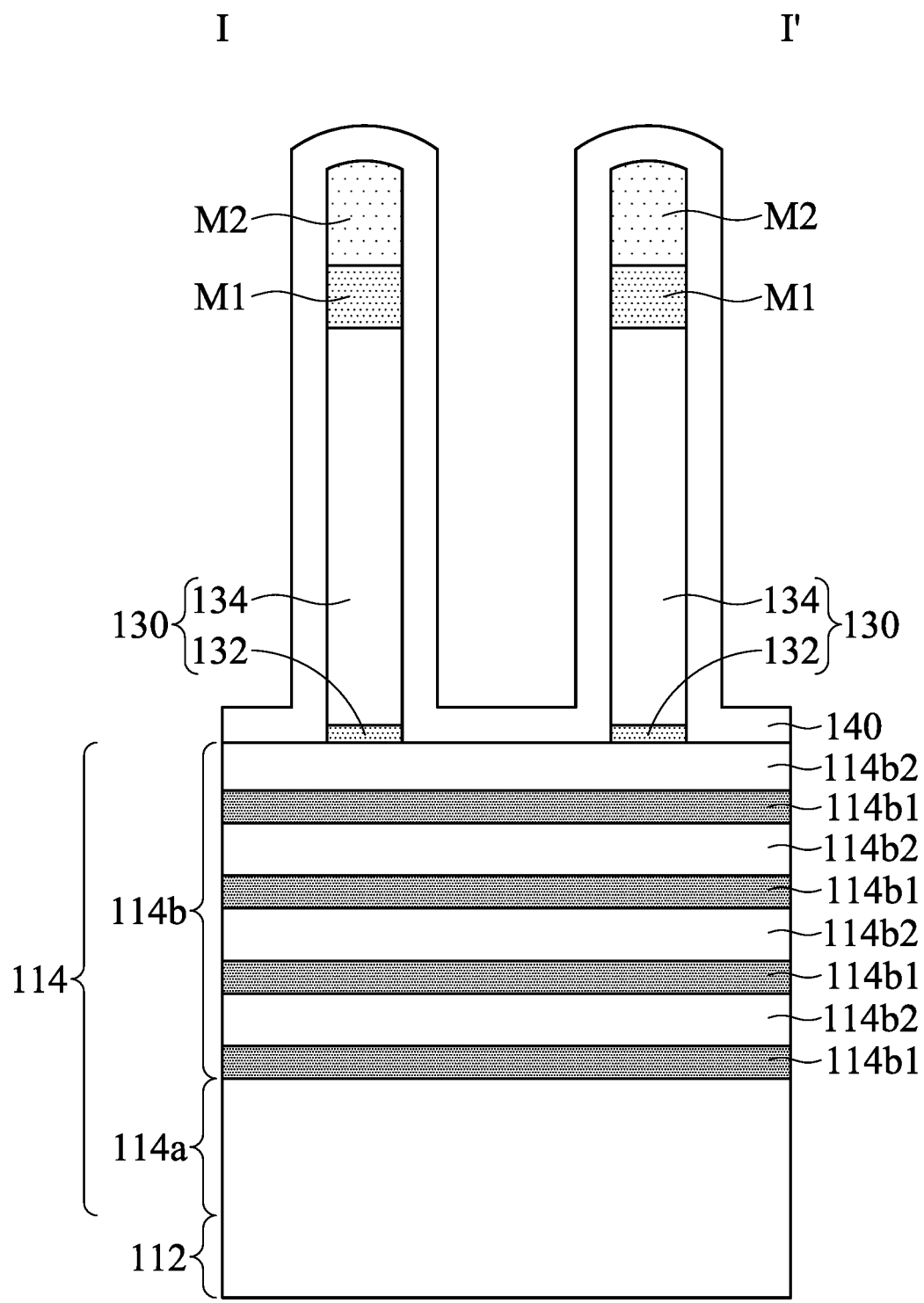

FIG. 2B-1 is a cross-sectional view illustrating the semiconductor device structure along a sectional line I-I' in FIG. 2B, in accordance with some embodiments. As shown in FIGS. 2B and 2B-1, a spacer layer 140 is conformally formed over the fin structures 114 and 116, the dielectric layer 120, the gate stacks 130, and the mask layers M1 and M2, in accordance with some embodiments.

In some embodiments, as shown in FIG. 2B, the spacer layer 140 is a single-layered structure. In some other embodiments (not shown), the spacer layer 140 is a multi-layered structure. The spacer layer 140 includes layers, in accordance with some embodiments. The layers are made of different materials, in accordance with some embodiments.

In some embodiments, the spacer layer 140 is made of an oxide-containing insulating material, such as silicon oxide. In some other embodiments, the spacer layer 140 is made of a nitride-containing insulating material, such as silicon nitride (SiN), silicon oxynitride (SiON), silicon oxycarbonitride (SiOCN), or silicon carbonitride (SiCN). The spacer layer 140 is formed using a deposition process, such as a chemical vapor deposition (CVD) process, an atomic layer deposition (ALD) process, or a physical vapor deposition (PVD) process, in accordance with some embodiments.

Figure 2C:
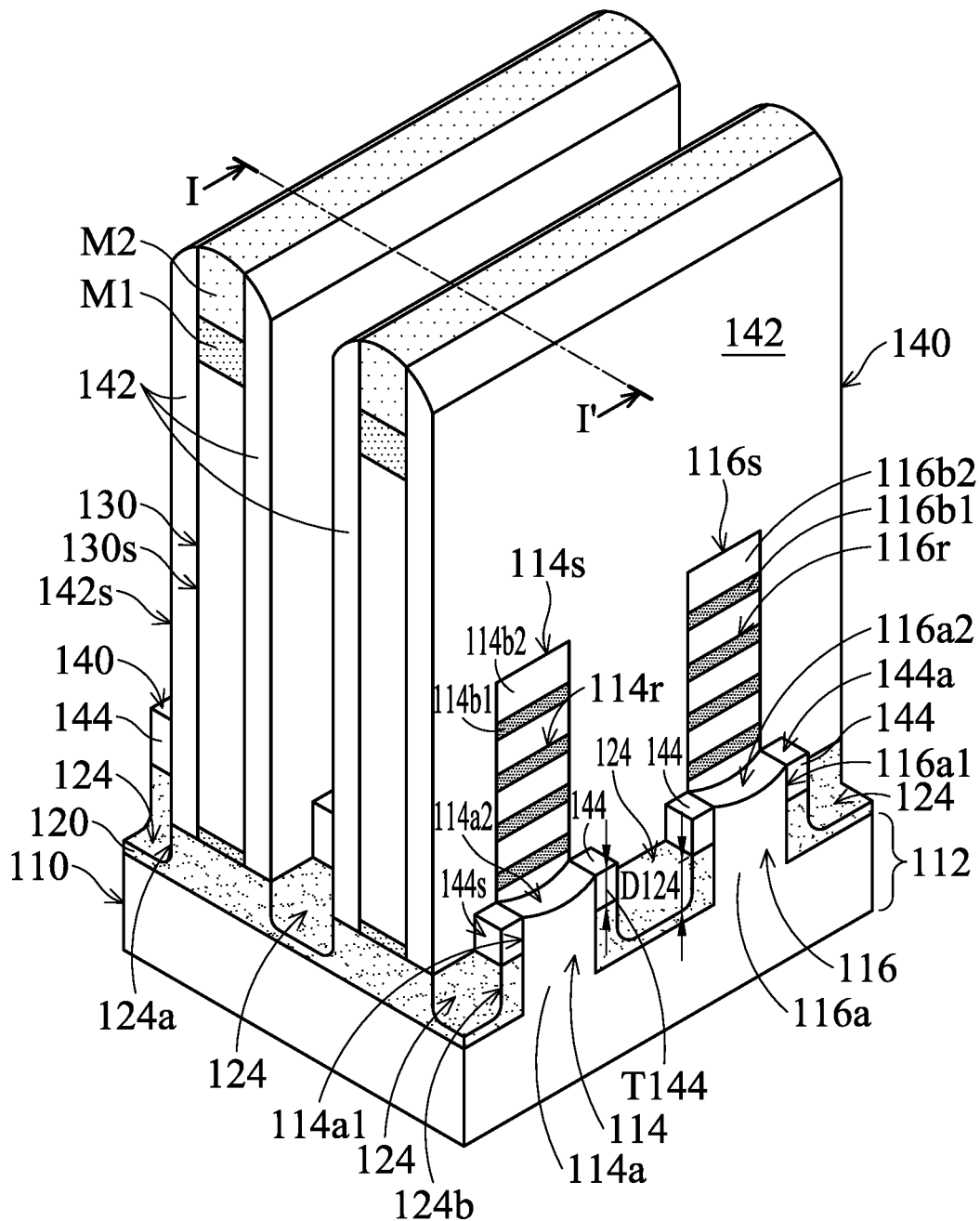
Figures 1, 2C:
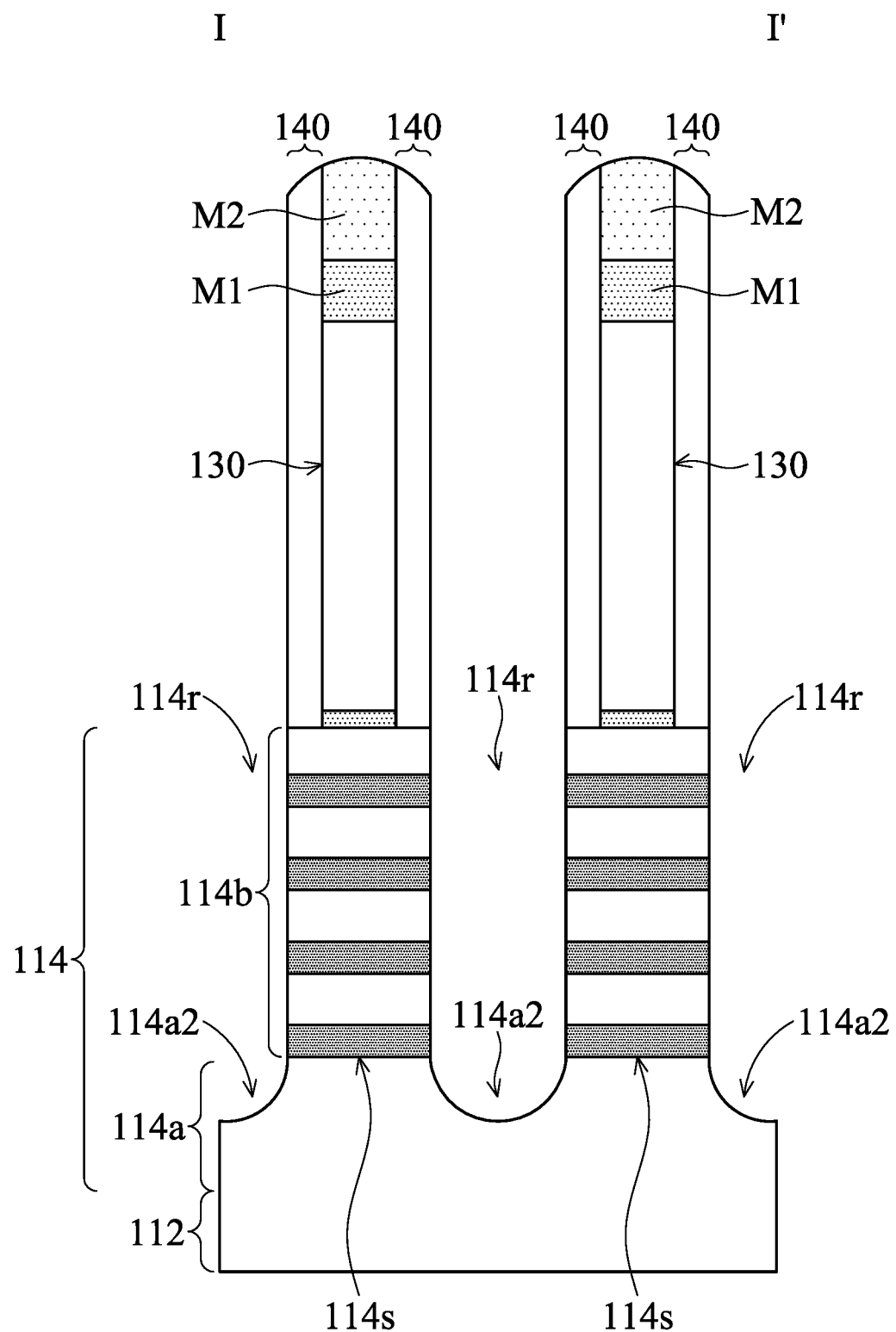

FIG. 2C-1 is a cross-sectional view illustrating the semiconductor device structure along a sectional line I-I' in FIG. 2C, in accordance with some embodiments. As shown in FIGS. 2B, 2C, and 2C-1, portions of the spacer layer 140 and the multilayer stacks 114b and 116b, which are not covered by the gate stacks 130 and the spacer layer 140 over the sidewalls 130s of the gate stacks 130, are removed, in accordance with some embodiments.

After the removal process, the spacer layer 140 remains over the opposite sidewalls 130s of the gate stacks 130, opposite sidewalls of the mask layers M1 and M2, and the opposite sidewalls 114a1 and 116a1 of the fins 114a and 116a of the fin structures 114 and 116, in accordance with some embodiments.

The spacer layer 140 remaining over the opposite sidewalls of the gate stacks 130 and the opposite sidewalls of the mask layers M1 and M2 forms spacers 142, in accordance with some embodiments. The spacer layer 140 remaining over the opposite sidewalls 114a1 and 116a1 of the fins 114a and 116a of the fin structures 114 and 116 forms spacers 144, in accordance with some embodiments.

As shown in FIG. 2C, a top surface 144a of the spacer 144 is substantially level with (or substantially aligned with) the upper surface 114a2 of the fin 114a of the fin structure 114, in accordance with some embodiments. The top surface 144a of the spacer 144 is substantially level with (or substantially aligned with) the upper surface 116a2 of the fin 116a of the fin structure 116, in accordance with some embodiments.

The removal process forms recesses 114r and 116r in the fin structures 114 and 116, in accordance with some embodiments. The fin 114a has an upper surface 114a2, in accordance with some embodiments. The upper surface 114a2 is a concave curved upper surface, in accordance with some embodiments. The fin 116a has an upper surface 116a2, in accordance with some embodiments. The upper surface 116a2 is a concave curved upper surface, in accordance with some embodiments.

The multilayer structure 114b is divided into multilayer stacks 114s by the recesses 114r, in accordance with some embodiments. Each multilayer stack 114s includes four layers of the sacrificial layers 114b1 and four layers of the channel layers 114b2, in accordance with some embodiments.

The multilayer structure 116b is divided into multilayer stacks 116s by the recesses 116r, in accordance with some embodiments. Each multilayer stack 116s includes four layers of the sacrificial layers 116b1 and four layers of the channel layers 116b2, in accordance with some embodiments. The removal process for forming the recesses 114r and 116r includes an etching process, such as an anisotropic etching process (e.g., a dry etching process), in accordance with some embodiments.

Figure 2D:
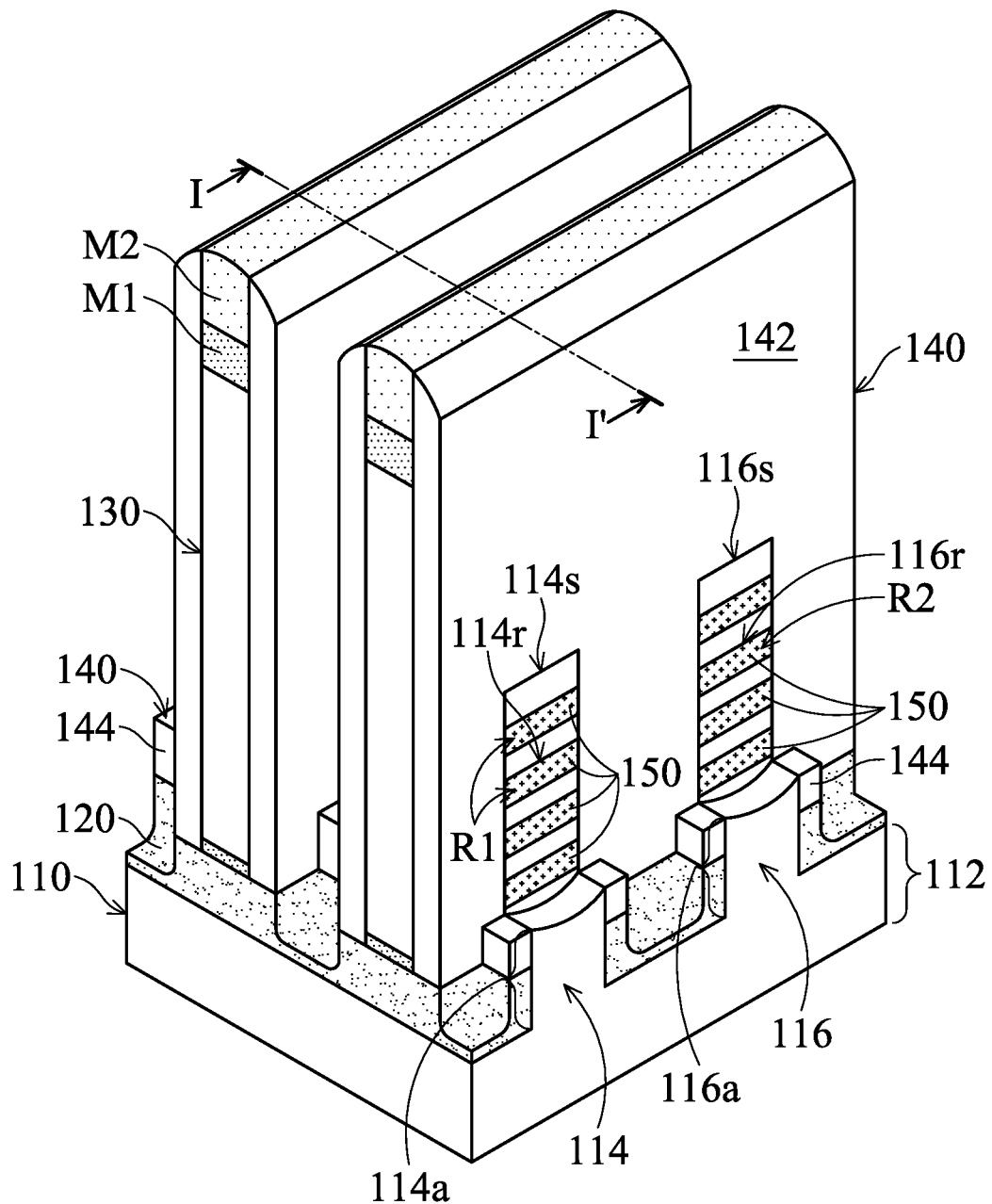
Figures 1, 2D:
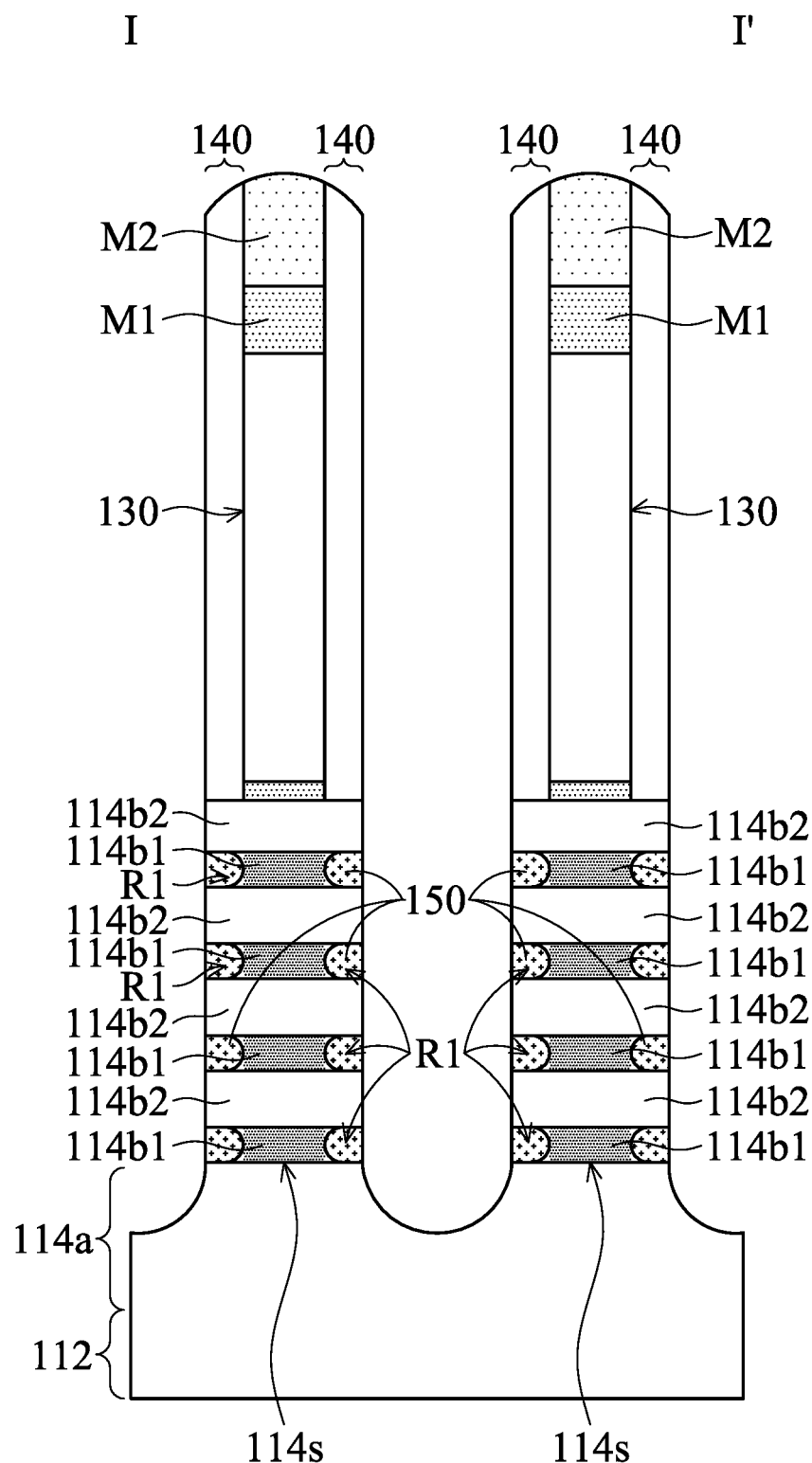

FIG. 2D-1 is a cross-sectional view illustrating the semiconductor device structure along a sectional line I-I' in FIG. 2D, in accordance with some embodiments. As shown in FIGS. 2D and 2D-1, portions of the sacrificial layers 114b1 are removed from sidewalls of the sacrificial layers 114b1 to form recesses R1 in the multilayer stacks 114s, in accordance with some embodiments. Each recess R1 is surrounded by the corresponding sacrificial layer 114b1 and the corresponding channel layers 114b2, in accordance with some embodiments.

As shown in FIGS. 2C and 2D, portions of the sacrificial layers 116b1 are removed from sidewalls of the sacrificial layers 116b1 to form recesses R2 in the multilayer stacks 116s, in accordance with some embodiments. The removal process of the sacrificial layers 114b1 and 116b1 includes an etching process, such as an isotropic etching process (e.g., a dry etching process or a wet etching process), in accordance with some embodiments.

As shown in FIGS. 2D and 2D-1, an inner spacer layer 150 is formed in the recesses R1 and R2, in accordance with some embodiments. In some embodiments, the inner spacer layer 150 is made of an oxide-containing insulating material, such as silicon oxide.

In some other embodiments, the inner spacer layer 150 is made of a nitride-containing insulating material, such as silicon nitride (SiN), silicon oxynitride (SiON), silicon oxycarbonitride (SiOCN), or silicon carbonitride (SiCN). The inner spacer layer 150 is formed using a deposition process, such as a chemical vapor deposition process or a physical vapor deposition process, in accordance with some embodiments.

Figure 2E:
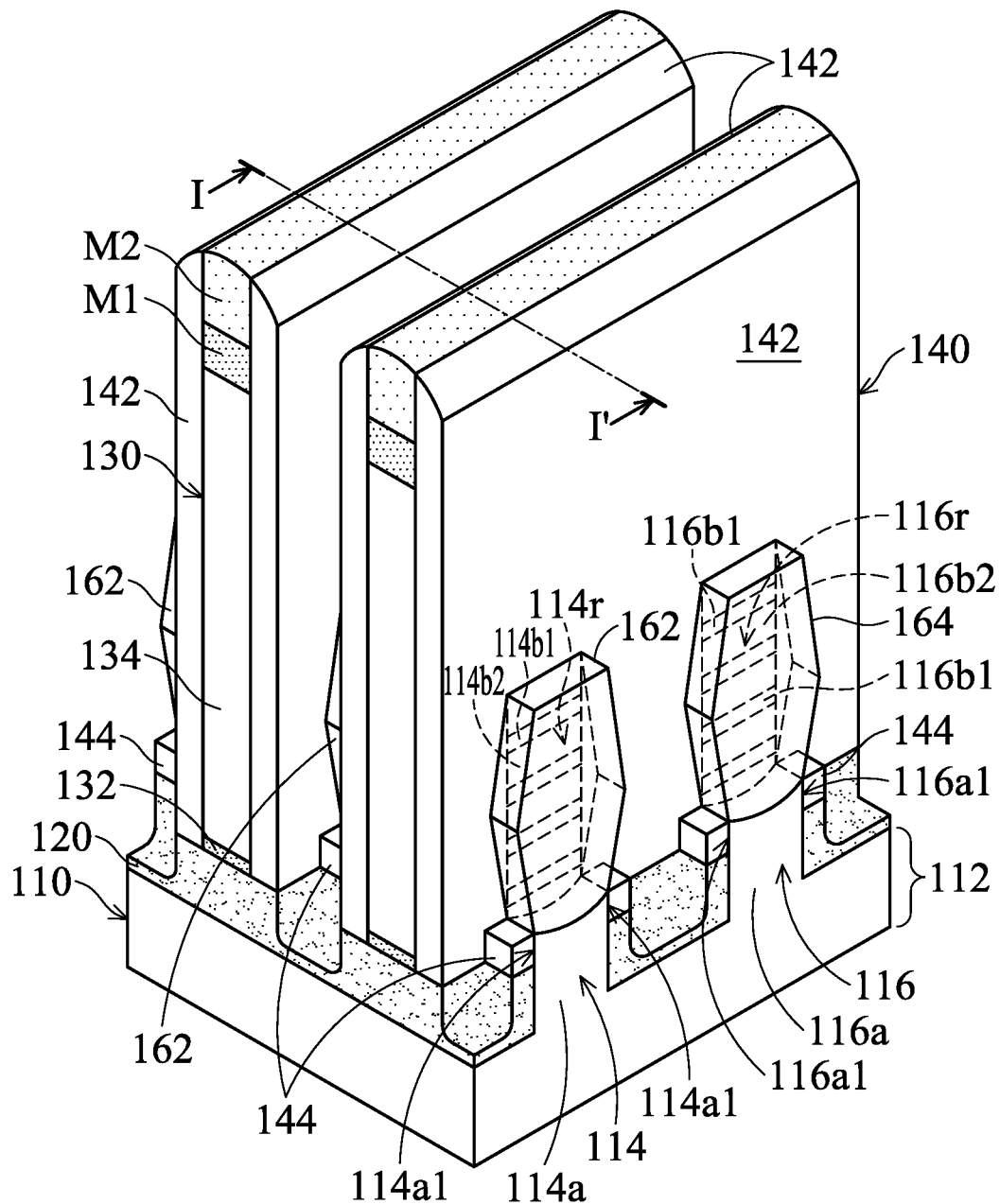
Figures 1, 2E:
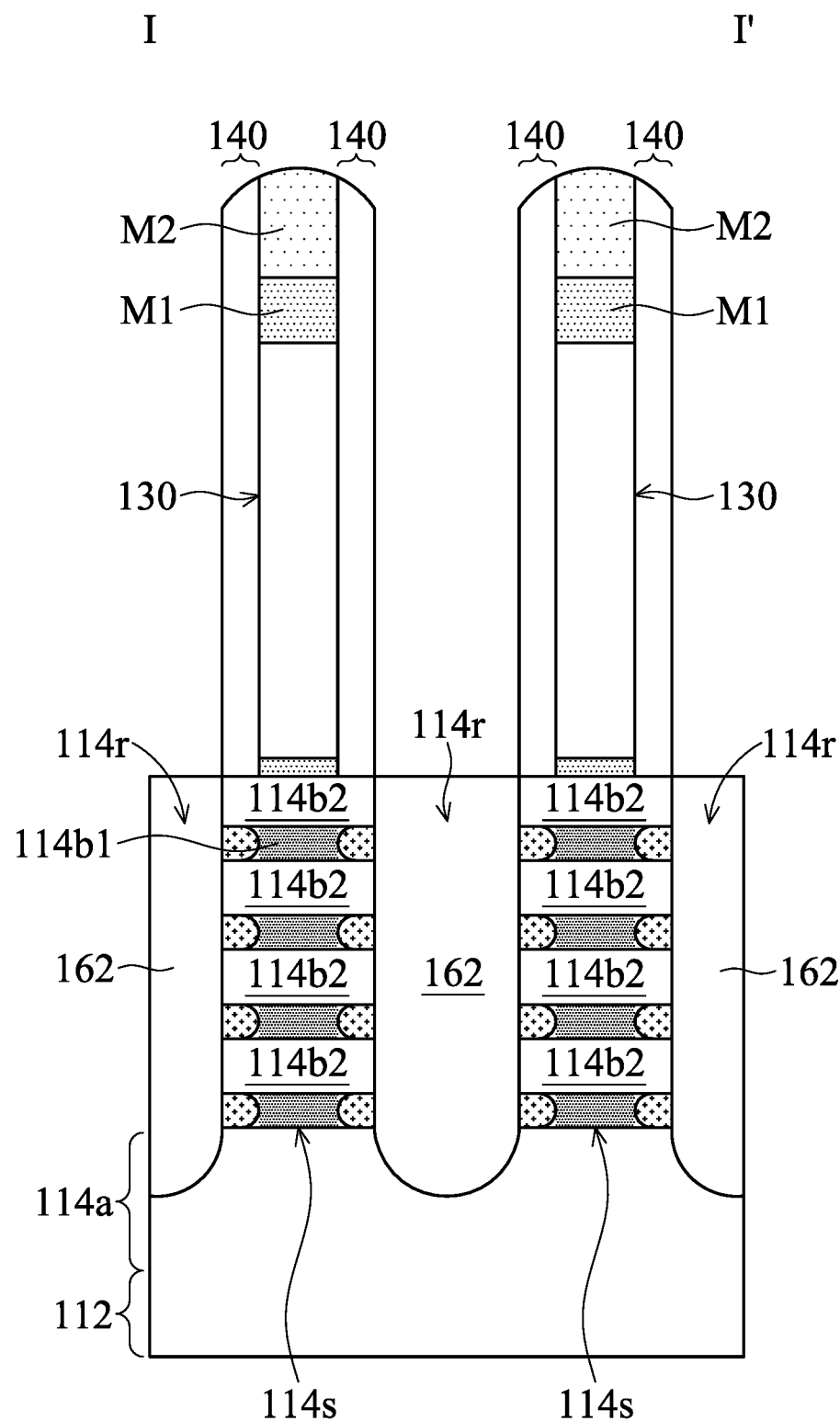

FIG. 2E-1 is a cross-sectional view illustrating the semiconductor device structure along a sectional line I-I' in FIG. 2E, in accordance with some embodiments. As shown in FIGS. 2E and 2E-1, source/drain structures 162 and 164 are respectively formed over the fins 114a and 116a of the fin structures 114 and 116, in accordance with some embodiments.

As shown in FIGS. 2E and 2E-1, the source/drain structures 162 are in the corresponding recesses 114r, in accordance with some embodiments. The source/drain structures 162 are in direct contact with the fin 114a, in accordance with some embodiments. The source/drain structures 164 are in the corresponding recesses 116r, in accordance with some embodiments. The source/drain structures 164 are in direct contact with the fin 116a, in accordance with some embodiments.

Since the spacers 144 cover the opposite sidewalls 114a1 and 116a1 of the fins 114a and 116a of the fin structures 114 and 116, the spacers 144 are able to prevent the source/drain structures 162 and 164 from forming over the sidewalls 114a1 and 116a1 of the fins 114a and 116a.

Therefore, the spacers 144 are able to constrain the size (e.g., the width) of the source/drain structures 162 and 164 to avoid that the source/drain structures 162 and 164 are in direct contact with each other, in accordance with some embodiments. Therefore, the yield of the source/drain structures 162 and 164 is improved, in accordance with some embodiments.

In some embodiments, the source/drain structures 162 are made of a semiconductor material (e.g., silicon germanium) with P-type dopants, such as the Group IIIA element, in accordance with some embodiments. The Group IIIA element includes boron or another suitable material.

In some other embodiments, the source/drain structures 164 are made of a semiconductor material (e.g., silicon) with N-type dopants, such as the Group VA element, in accordance with some embodiments. The Group VA element includes phosphor (P), antimony (Sb), or another suitable Group VA material. The source/drain structures 162 and 164 are formed using an epitaxial process, in accordance with some embodiments.

The source/drain structures 162 and 164 are made of different materials, in accordance with some embodiments. Therefore, the source/drain structures 162 and 164 are formed using different epitaxial growth processes, in accordance with some embodiments.

For example, the formation of the source/drain structures 162 and 164 includes forming a first mask layer (not shown) over the fin 116a of the fin structure 116; forming the source/drain structures 162 over the fin 114a of the fin structure 114; removing the first mask layer; forming a second mask layer (not shown) over the source/drain structures 162; forming the source/drain structures 164 over the fin 116a of the fin structure 116; and removing the second mask layer.

Figure 2F:
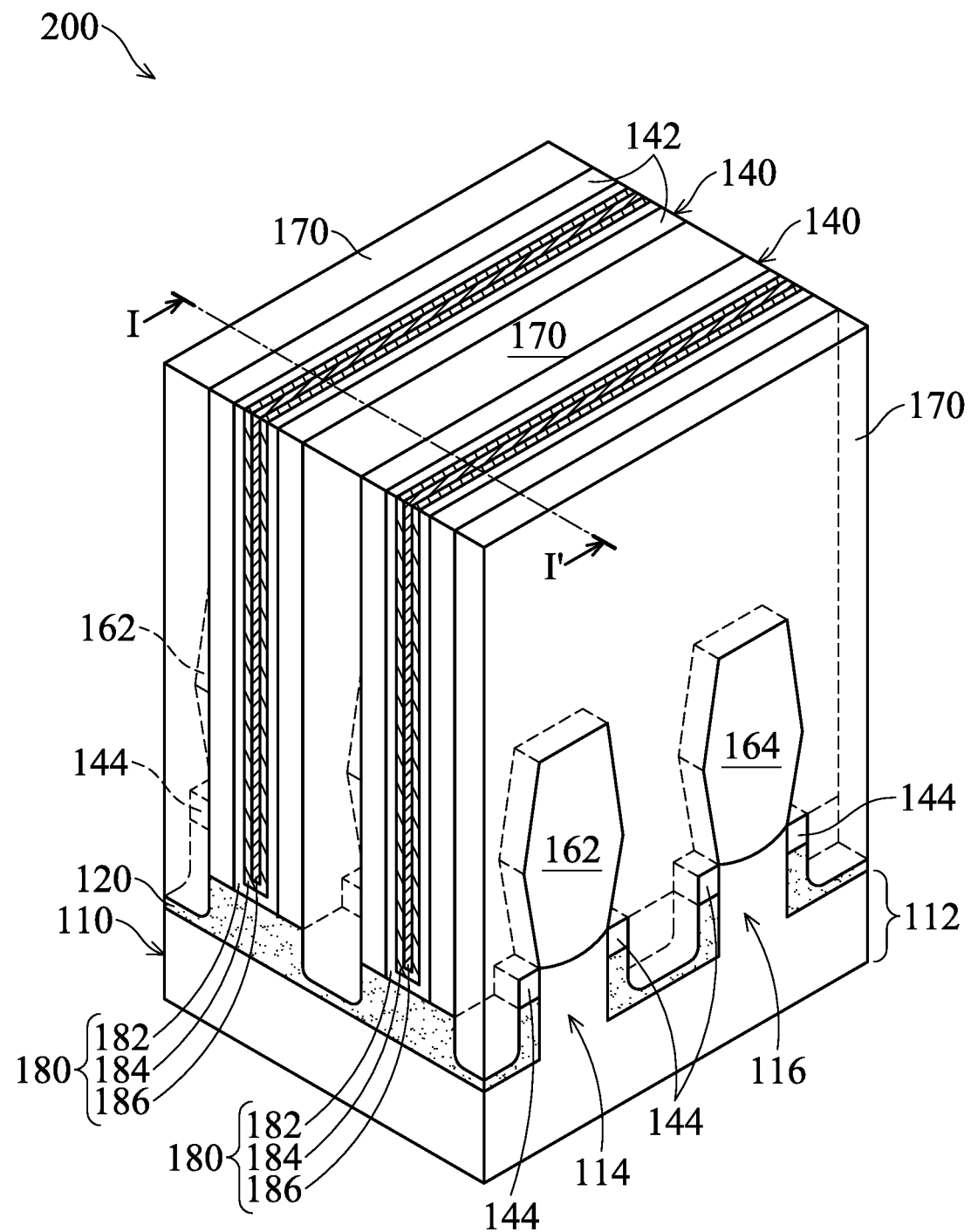
Figures 1, 2F:
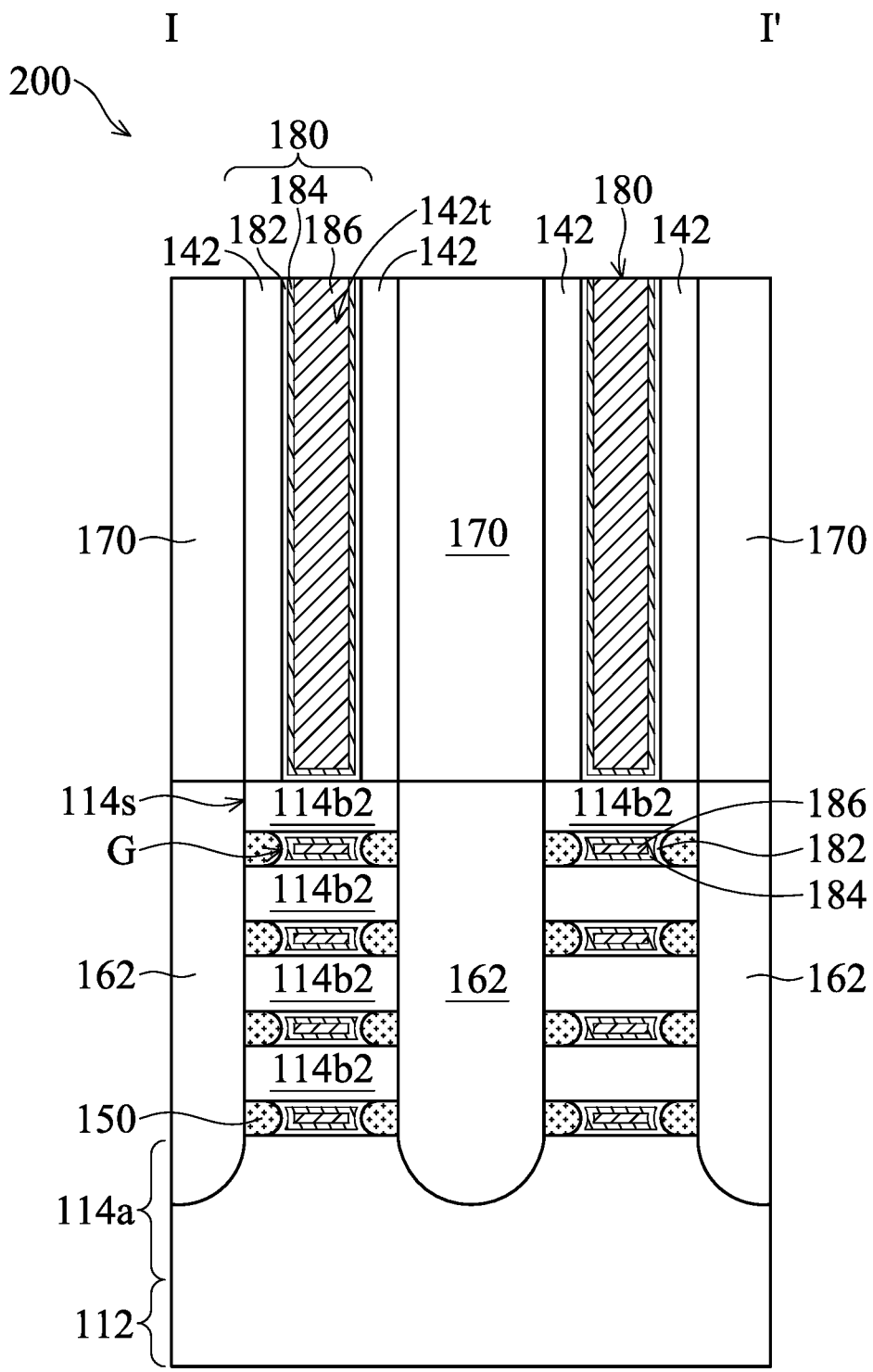

FIG. 2F-1 is a cross-sectional view illustrating the semiconductor device structure along a sectional line I-I' in FIG. 2F, in accordance with some embodiments. As shown in FIGS. 2E, 2F and 2F-1, a dielectric layer 170 is formed over the source/drain structures 162 and 164, the spacer layer 140, and the mask layers M1 and M2, in accordance with some embodiments.

The dielectric layer 170 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

As shown in FIGS. 2F and 2F-1, top portions of the dielectric layer 170 and the spacer layer 140, and the mask layers M1 and M2 are removed, in accordance with some embodiments. The removal process includes a planarization process, such as a chemical mechanical polishing process, in accordance with some embodiments.

As shown in FIGS. 2E, 2F and 2F-1, the gate electrodes 134 are removed to form trenches 142t in the spacers 142, in accordance with some embodiments. The removal process includes an etching process, such as a wet etching process or a dry etching process, in accordance with some embodiments.

As shown in FIGS. 2E, 2F, and 2F-1, the gate dielectric layers 132 are removed through the trenches 142*t*, in accordance with some embodiments. The removal process includes an etching process, such as a wet etching process or a dry etching process, in accordance with some embodiments.

As shown in FIGS. 2E, 2E-1, 2F, and 2F-1, the sacrificial layers 114*b*1 and 116*b*1 are removed through the trenches 142*t*, in accordance with some embodiments. The removal process includes an etching process, such as a wet etching process or a dry etching process, in accordance with some embodiments.

As shown in FIGS. 2F and 2F-1, gate stacks 180 are formed in the trenches 142*t*, in accordance with some embodiments. Each gate stack 180 includes a gate dielectric layer 182, a work function layer 184, and a gate electrode layer 186, in accordance with some embodiments.

As shown in FIGS. 2E, 2F and 2F-1, the gate dielectric layer 182, the work function layer 184, and the gate electrode layer 186 are sequentially stacked over the channel layers 114*b*2 and 116*b*2, in accordance with some embodiments. The gate stack 180 wraps around the channel layers 114*b*2 and 116*b*2, in accordance with some embodiments. The inner spacer layer 150 electrically insulates the source/drain structures 162 and 164 from the gate stacks 180, in accordance with some embodiments. In this step, a semiconductor device structure 200 is substantially formed, in accordance with some embodiments.

Processes and materials for forming the semiconductor device structure 200 may be similar to, or the same as, those for forming the semiconductor device structure 100 described above. Elements designated by the same or similar reference numbers as those in FIGS. 1A to 2F have the same or similar structures and the materials. Therefore, the detailed descriptions thereof will not be repeated herein.

In accordance with some embodiments, semiconductor device structures and methods for forming the same are provided. The methods (for forming the semiconductor device structure) form spacers over opposite sidewalls of a fin structure to prevent a source/drain structure from forming over the sidewalls of the fin structure. Therefore, the spacers are able to constrain the size (e.g., the width) of the source/drain structure to avoid that the source/drain structure is in direct contact with an adjacent source/drain structure. Therefore, the yield of the source/drain structure is improved.

In accordance with some embodiments, a method for forming a semiconductor device structure is provided. The method includes forming a dielectric layer over a substrate. The substrate has a base and a fin structure over the base, and the dielectric layer is over the base and surrounds the fin structure. The method includes forming a gate stack over the fin structure and the dielectric layer. The gate stack is wrapped around an upper portion of the fin structure. The method includes removing portions of the dielectric layer, which are not covered by the gate stack. The method includes forming first spacers over first sidewalls of the gate stack. The method includes forming second spacers over second sidewalls of the fin structure. The method includes partially removing the fin structure, which is not covered by the gate stack and the first spacers. The method includes forming a source/drain structure over the fin structure, which is not covered by the gate stack and the first spacers.

In accordance with some embodiments, a method for forming a semiconductor device structure is provided. The method includes forming a dielectric layer over a substrate. The substrate has a base and a fin structure over the base, and the dielectric layer is over the base and surrounds a lower portion of the fin structure. The method includes forming a gate stack over the fin structure and the dielectric layer. The gate stack is wrapped around an upper portion of the fin structure. The method includes forming first spacers over first sidewalls of the gate stack. The method includes forming second spacers over second sidewalls of the fin structure. The method includes partially removing the fin structure and the dielectric layer, which are not covered by the gate stack, the first spacers, and the second spacers, wherein an upper surface of the fin structure, which is not covered by the gate stack, the first spacers, and the second spacers, is higher than a top surface of the dielectric layer. The method includes forming a source/drain structure over the upper surface of the fin structure. The source/drain structure is above the second spacers.

In accordance with some embodiments, a semiconductor device structure is provided. The semiconductor device structure includes a substrate having a base and a fin structure over the base. The semiconductor device structure includes a dielectric layer over the base and surrounding the fin structure. The semiconductor device structure includes a gate stack over the fin structure and the dielectric layer. The gate stack is wrapped around an upper portion of the fin structure. The semiconductor device structure includes a first spacer over a first sidewall of the gate stack. The semiconductor device structure includes a second spacer over a second sidewall of the fin structure, wherein a top surface of the second spacer is substantially level with an upper surface of the fin structure. The semiconductor device structure includes a source/drain structure over the upper surface of the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a dielectric layer over a substrate, wherein the substrate has a base and a fin structure over the base, and the dielectric layer is over the base and surrounds the fin structure;

forming a gate stack over the fin structure and the dielectric layer, wherein the gate stack is wrapped around an upper portion of the fin structure;

removing portions of the dielectric layer, which are not covered by the gate stack;

forming first spacers over first sidewalls of the gate stack after removing the portions of the dielectric layer, which are not covered by the gate stack;

forming second spacers over second sidewalls of the fin structure after removing the portions of the dielectric layer, which are not covered by the gate stack;

partially removing the fin structure, which is not covered by the gate stack and the first spacers; and forming a source/drain structure over the fin structure, which is not covered by the gate stack and the first spacers, wherein the second spacer is thinner than the dielectric layer.

2. The method for forming the semiconductor device structure as claimed in claim 1, wherein a top surface of the second spacer is substantially aligned with an upper surface of the fin structure after partially removing the fin structure, which is not covered by the gate stack and the first spacers.

3. The method for forming the semiconductor device structure as claimed in claim 1, wherein the removing of the portions of the dielectric layer, which are not covered by the gate stack, forms a recess in the dielectric layer, and a sidewall of the gate stack is substantially aligned with an inner wall of the recess.

4. The method for forming the semiconductor device structure as claimed in claim 1, wherein the fin structure has a concave upper surface after partially removing the fin structure, which is not covered by the gate stack and the first spacers.

5. The method for forming the semiconductor device structure as claimed in claim 1, wherein the source/drain structure is in direct contact with the second spacers.

6. The method for forming the semiconductor device structure as claimed in claim 1, wherein the forming of the first spacers and the second spacers comprises:

forming a spacer layer over the gate stack, the fin structure, and the dielectric layer; and partially removing the spacer layer over a first top surface of the gate stack, a second top surface of the fin structure, and a third top surface of the dielectric layer.

7. The method for forming the semiconductor device structure as claimed in claim 6, wherein the partially removing of the spacer layer over the first top surface of the gate stack, the second top surface of the fin structure, and the third top surface of the dielectric layer further comprises:

partially removing the dielectric layer, which is not covered by the first spacers, the second spacers, and the gate stack, to form a recess in the dielectric layer.

8. The method for forming the semiconductor device structure as claimed in claim 7, wherein a first inner wall of the recess is substantially aligned with a first sidewall of the first spacer.

9. The method for forming the semiconductor device structure as claimed in claim 8, wherein a second inner wall of the recess is substantially aligned with a second sidewall of the second spacer.

10. The method for forming the semiconductor device structure as claimed in claim 1, wherein the second spacer is thinner than the fin structure.

11. A method for forming a semiconductor device structure, comprising:

forming a dielectric layer over a substrate, wherein the substrate has a base and a fin structure over the base, and the dielectric layer is over the base and surrounds a lower portion of the fin structure;

forming a gate stack over the fin structure and the dielectric layer, wherein the gate stack is wrapped around an upper portion of the fin structure;

forming first spacers over first sidewalls of the gate stack;

forming second spacers over second sidewalls of the fin structure;

partially removing the fin structure and the dielectric layer, which are not covered by the gate stack, the first spacers, and the second spacers, wherein an upper surface of the fin structure, which is not covered by the gate stack, the first spacers, and the second spacers, is higher than a top surface of the dielectric layer; and forming a source/drain structure over the upper surface of the fin structure, wherein the source/drain structure is above the second spacers.

12. The method for forming the semiconductor device structure as claimed in claim 11, wherein the partially removing of the fin structure and the dielectric layer, which are not covered by the gate stack, the first spacers, and the second spacers, forms a recess in the dielectric layer, and a depth of the recess is greater than a thickness of the second spacer.

13. The method for forming the semiconductor device structure as claimed in claim 11, wherein after partially removing the fin structure and the dielectric layer, a first thickness of the fin structure, which is not covered by the gate stack, the first spacers, and the second spacers, is substantially equal to a sum of a second thickness of the dielectric layer and a third thickness of the second spacer.

14. The method for forming the semiconductor device structure as claimed in claim 11, wherein the partially removing of the fin structure and the dielectric layer, which are not covered by the gate stack, the first spacers, and the second spacers, forms a recess, and a first inner wall of the recess is substantially aligned with a first sidewall of the first spacer.

15. The method for forming the semiconductor device structure as claimed in claim 14, wherein a second inner wall of the recess is substantially aligned with a second sidewall of the second spacer.

16. A method for forming a semiconductor device structure, comprising:

forming a dielectric layer over a substrate, wherein the substrate has a base and a fin structure over the base, and the dielectric layer is over the base and surrounds the fin structure;

forming a gate stack over the fin structure and the dielectric layer, wherein the gate stack is wrapped around an upper portion of the fin structure;

removing portions of the dielectric layer, which are not covered by the gate stack, to form a first recess in the dielectric layer, wherein a first inner wall of the first recess is substantially level with a first sidewall of the gate stack;

forming a first spacer over the first sidewall of the gate stack and the first inner wall of the first recess;

forming a second spacer over a second sidewall of the fin structure;

partially removing the fin structure, which is not covered by the gate stack and the first spacer; and forming a source/drain structure over the fin structure, which is not covered by the gate stack and the first spacer.

17. The method for forming the semiconductor device structure as claimed in claim 16, wherein the first spacer conformally covers the first sidewall of the gate stack and the first inner wall of the first recess.

18. The method for forming the semiconductor device structure as claimed in claim 16, further comprising:

partially removing the dielectric layer to form a second recess in the dielectric layer during the partially removing of the fin structure, wherein a second inner wall of the second recess is substantially level with a third sidewall of the first spacer.

19. The method for forming the semiconductor device structure as claimed in claim 18, wherein a third inner wall of the second recess is substantially level with a fourth sidewall of the second spacer.

20. The method for forming the semiconductor device structure as claimed in claim 19, wherein the second recess is narrower than the first recess.

* * * * *